(12) United States Patent
Ahn et al.

(10) Patent No.: US 12,321,067 B2
(45) Date of Patent: Jun. 3, 2025

(54) DISPLAY DEVICE

(71) Applicant: Samsung Display Co., Ltd., Yongin-si (KR)

(72) Inventors: Jeaheon Ahn, Hwaseong-si (KR); Jae Cheol Park, Hwaseong-si (KR); Keunchan Oh, Hwaseong-si (KR); Jangsoo Kim, Hwaseong-si (KR); Jeongki Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 16 days.

(21) Appl. No.: 17/445,672

(22) Filed: Aug. 23, 2021

(65) Prior Publication Data

US 2022/0109123 A1    Apr. 7, 2022

(30) Foreign Application Priority Data

Oct. 6, 2020 (KR) .................. 10-2020-0128665

(51) Int. Cl.
*H10K 50/842* (2023.01)
*G02F 1/1339* (2006.01)
(Continued)

(52) U.S. Cl.
CPC ....... *G02F 1/1339* (2013.01); *H10K 50/8428* (2023.02); *H10K 59/12* (2023.02);
(Continued)

(58) Field of Classification Search
CPC ................ H10K 50/8428; H10K 59/38; G02F 1/133614; H01L 33/501; H01L 33/502; H01L 33/507
See application file for complete search history.

(56) References Cited

U.S. PATENT DOCUMENTS 9,323,100 B1    4/2016 Feng et al.
2011/0090445 A1    4/2011 Kim et al.
(Continued)

FOREIGN PATENT DOCUMENTS

KR    10-2011-0042663 A    4/2011
KR    10-2019-0022968 A    3/2019
(Continued)

*Primary Examiner* — Angela M. Medich
(74) *Attorney, Agent, or Firm* — Womble Bond Dickinson (US) LLP

(57) ABSTRACT

A display device according to an embodiment may include a first substrate including an array of pixels, a second substrate coupled to the first substrate, and a sealing member between the first substrate and the second substrate. The second substrate may include a base substrate including a display area overlapping the array of pixels and a peripheral area around the display area; a first compensation structure in the peripheral area, on the base substrate, at least partially overlapping the sealing member, and including an organic material; a second compensation structure in the peripheral area, on the base substrate, spaced apart from the first compensation structure, at least partially overlapping the sealing member, and including the same material as that of the first compensation structure, and a first capping layer covering the first and second compensation structures and including an inorganic material.

17 Claims, 27 Drawing Sheets

(51) Int. Cl.
*H10K 59/12* (2023.01)
*H10K 59/38* (2023.01)
*H10K 59/80* (2023.01)

(52) U.S. Cl.
CPC ......... *H10K 59/38* (2023.02); *H10K 59/8722* (2023.02); *H10K 59/8723* (2023.02)

(56) References Cited

U.S. PATENT DOCUMENTS

| | | | | |
|---|---|---|---|---|
| 2014/0312339 | A1* | 10/2014 | Fujita | H10K 59/35 257/40 |
| 2016/0195741 | A1 | 7/2016 | Shiau | |
| 2016/0372528 | A1 | 12/2016 | Kamura et al. | |
| 2018/0088405 | A1* | 3/2018 | Nagasawa | G02F 1/133512 |
| 2020/0326586 | A1 | 10/2020 | Kim et al. | |

FOREIGN PATENT DOCUMENTS

| | | |
|---|---|---|
| KR | 10-2019-0050886 A | 5/2019 |
| KR | 10-2021-0012101 A | 2/2021 |
| KR | 10-2021-0016129 A | 2/2021 |

* cited by examiner

DISPLAY DEVICE

CROSS-REFERENCE TO RELATED APPLICATION(S)

This application claims priority to and the benefit of Korean Patent Application No. 10-2020-0128665, filed on Oct. 6, 2020, the entire content of which is hereby incorporated by reference.

BACKGROUND

1. Field

Embodiments of the present disclosure relate to a display device. More particularly, embodiments of the present disclosure relate to a display device including an upper substrate and a lower substrate combined with each other by a sealing member.

2. Description of the Related Art

Flat panel display devices are replacing cathode ray tube display devices as display devices due to their relative lightweight and thin characteristics. As representative examples of such flat panel display devices, there are liquid crystal display devices and organic light emitting diode display devices.

The flat panel display device may include an upper substrate and a lower substrate. The lower substrate may be a display substrate including an array of pixels. The upper substrate may be a color conversion substrate including a color conversion layer. The flat panel display may include a display area in which an image is to be displayed and a peripheral area around (e.g., surrounding) the display area. A sealing member may be disposed in the peripheral area between the upper substrate and the lower substrate. The upper substrate and the lower substrate may be combined with each other by the sealing member.

SUMMARY

Aspects of embodiments of the present disclosure are directed toward a display device with improved reliability.

Additional aspects and/or features of the present disclosure will be set forth in the description which follows, and in part will be apparent from the description, or may be learned by practice of the present disclosure.

A display device according to an embodiment may include a first substrate including an array of pixels, a second substrate coupled to (e.g., combined with) the first substrate, and a sealing member between the first substrate and the second substrate. The second substrate may include a base substrate including a display area overlapping the array of pixels and a peripheral area around (e.g., surrounding) the display area; a first compensation structure in the peripheral area, on the base substrate, at least partially overlapping the sealing member, and including (e.g., being) an organic material; a second compensation structure in the peripheral area, on the base substrate, spaced apart from the first compensation structure, at least partially overlapping the sealing member, and including (e.g., being) the same material as that of the first compensation structure; and a first capping layer covering the first and second compensation structures and including (e.g., being) an inorganic material.

In an embodiment, a portion of the sealing member may be in (e.g., filled in or completely filled) a first opening between the first compensation structure and the second compensation structure.

In an embodiment, the sealing member may contact the first capping layer.

In an embodiment, the first compensation structure may be around the display area.

In an embodiment, the second compensation structure may be around (e.g., may surround) the first compensation structure.

In an embodiment, the second compensation structure may be less than the first compensation structure in width.

In an embodiment, a through hole exposing a portion of the first compensation structure may be in the second compensation structure.

In an embodiment, the first capping layer may cover a lower surface of the first compensation structure facing the first substrate, a lower surface of the second compensation structure facing the first substrate, an outer side surface of the first compensation structure, and an inner side surface of the second compensation structure.

In an embodiment, the second substrate may further include a third compensation structure in the peripheral area, on the base substrate, spaced apart from the second compensation structure, at least partially overlapping the sealing member, and including (e.g., being) the same material as that of the first compensation structure. A portion of the sealing member may be in (e.g., filled in or completely filled) a second opening between the second compensation structure and the third compensation structure.

In an embodiment, the third compensation structure may be around (e.g., may surround) the second compensation structure.

In an embodiment, the second substrate may further include a color conversion layer in the display area, on the base substrate, and including a wavelength-converting particle to (e.g., configured to) change a wavelength of an incident light to emit a light having a color different from the incident light; and a partition wall in the display area, on the base substrate, and around (e.g., surrounding) the color conversion layer. The first compensation structure may include (e.g., be) the same material as that of the partition wall.

In an embodiment, the second substrate may further include a functional layer in the peripheral area, between the base substrate and the first compensation structure, between the base substrate and the second compensation structure, and including (e.g., being) an organic material; and a second capping layer covering the functional layer and including (e.g., being) an inorganic material.

In an embodiment, the first and second compensation structures may contact the second capping layer.

In an embodiment, the functional layer may include a first functional layer around (e.g., surrounding) the display area; and a second functional layer spaced apart from the first functional layer and around (e.g., surrounding) the first functional layer.

In an embodiment, a third opening between the first functional layer and the second functional layer may overlap the first compensation structure.

In an embodiment, the second capping layer may cover a lower surface of the first functional layer facing the first substrate, a lower surface of the second functional layer facing the first substrate, an outer side surface of the first functional layer, and an inner side surface of the second functional layer.

In an embodiment, the second capping layer may expose an outer side surface of the second functional layer.

In an embodiment, the second substrate may further include a color filter layer in the display area and on the base substrate. The functional layer may include (e.g., be) the same material as that of the color filter layer.

In an embodiment, the sealing member may include a first portion overlapping the first compensation structure, a second portion overlapping the second compensation structure, and a third portion overlapping a first opening between the first compensation structure and the second compensation structure. The third portion may be less than the first portion or the second portion in width.

In an embodiment, the sealing member may include spacer particles.

The display device according to embodiments may include the first substrate, the second substrate combined with the first substrate and including the compensation structure, and the sealing member between the first substrate and the compensation structure. The opening may be formed in the compensation structure. Accordingly, penetration of foreign substances into the inside of the compensation structure may be prevented or reduced. Accordingly, adhesion between the first substrate and the second substrate may be improved, and reliability of the display device may be improved.

It is to be understood that both the foregoing general description and the following detailed description are explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure, and together with the description serve to explain the present disclosure.

DETAILED DESCRIPTION

Illustrative, non-limiting embodiments will be more clearly understood from the following detailed description in conjunction with the accompanying drawings.

As used herein, the use of the term "may," when describing embodiments of the present disclosure, refers to "one or more embodiments of the present disclosure." As used herein, the term "and/or" includes any and all combinations of one or more of the associated listed items.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. As used herein, the terms "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

It will be understood that when an element or layer is referred to as being "on", "connected to", "coupled to", or "adjacent to" another element or layer, it can be directly on, connected to, coupled to, or adjacent to the other element or layer, or one or more intervening element(s) or layer(s) may be present. In contrast, when an element or layer is referred to as being "directly on," "directly connected to", "directly coupled to", or "immediately adjacent to" another element or layer, there are no intervening elements or layers present.

Figure 1:
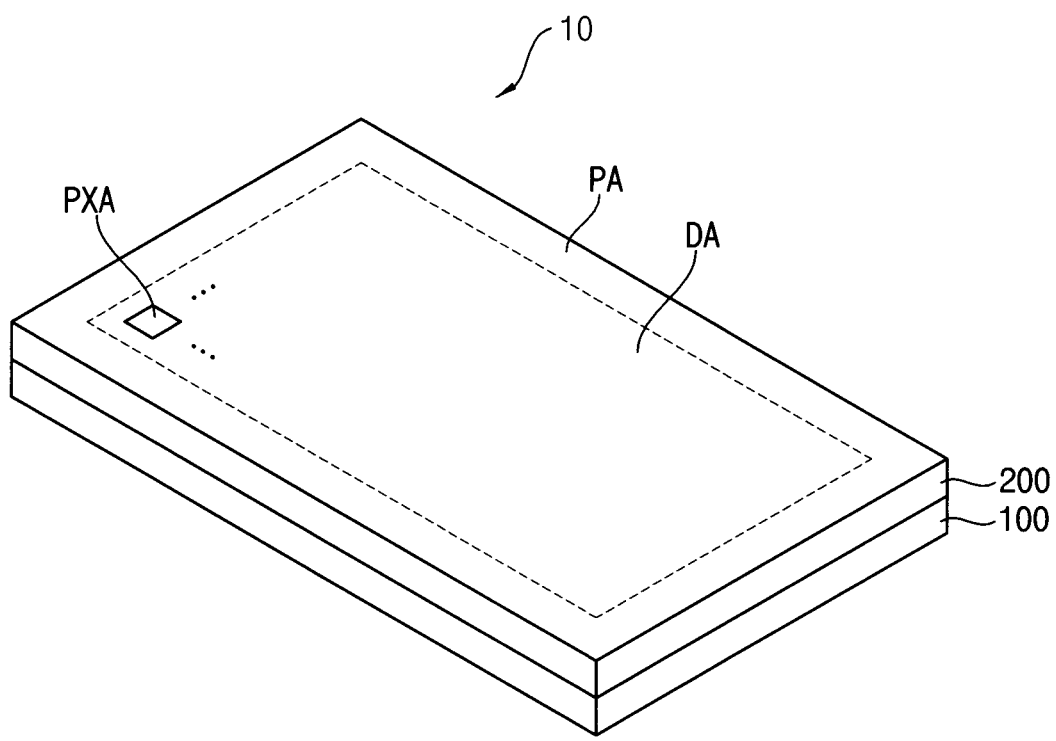
FIG. 1 is a perspective view illustrating a display device according to an embodiment.
Figure 2:
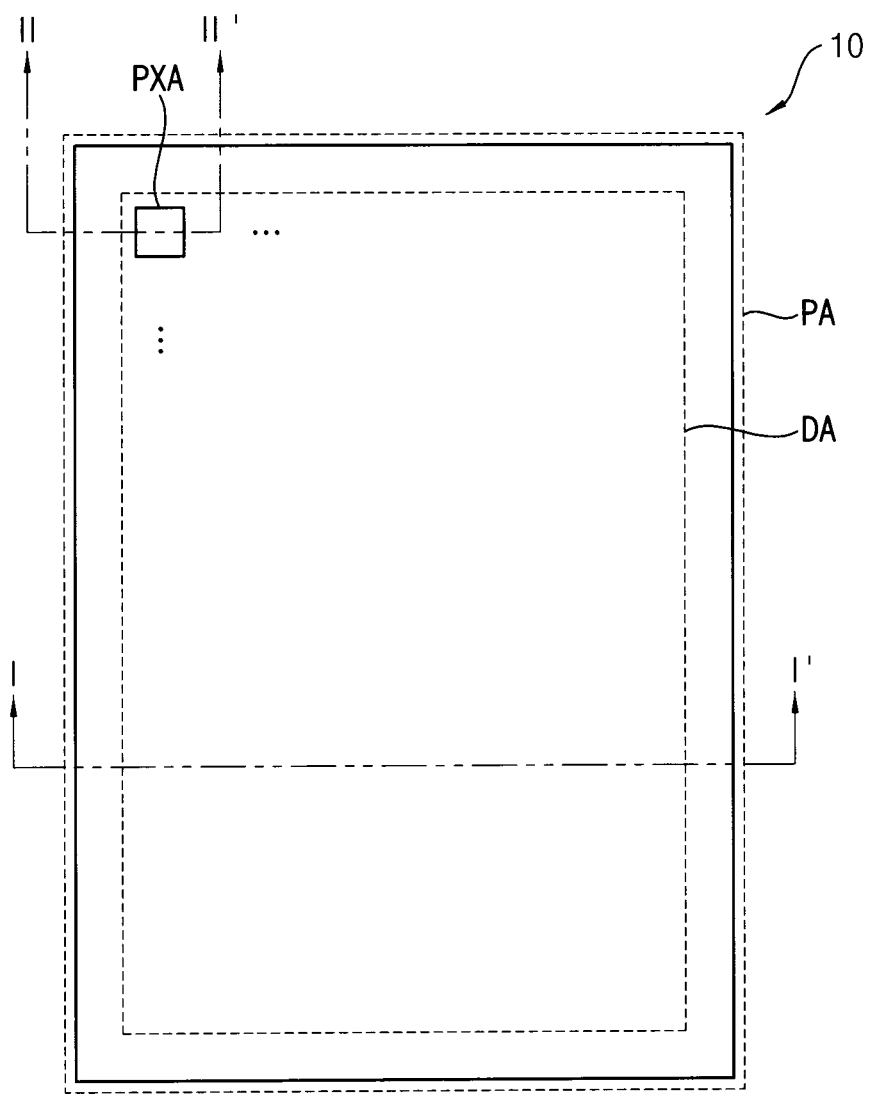
FIG. 2 is a plan view illustrating the display device of FIG. 1.
Figure 3:
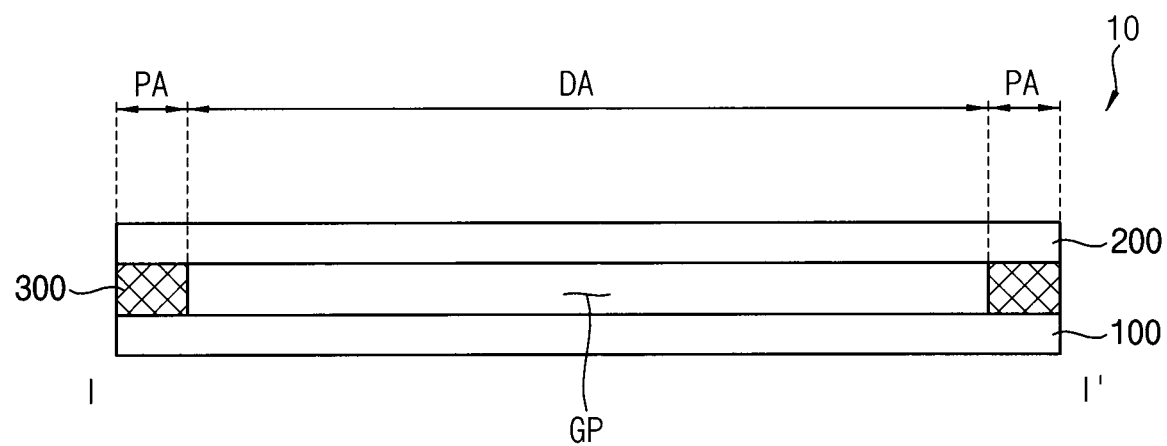
FIG. 3 is a cross-sectional view taken along line I-I' of FIG. 2.

FIG. 1 is a perspective view illustrating a display device according to an embodiment. FIG. 2 is a plan view illustrating the display device of FIG. 1. FIG. 3 is a cross-sectional view taken along line I-I' of FIG. 2.

Referring to FIGS. 1 to 3, a display device 10 according to an embodiment may include a display area DA and a peripheral area PA. An image may be displayed in the display area DA. The display area DA may include a plurality of pixel areas PXA. The peripheral area PA may be around (e.g., surround) the display area DA.

The display device 10 may include a first substrate 100 and a second substrate 200 combined with the first substrate 100. For example, the first substrate 100 may be an upper substrate, and the second substrate 200 may be a lower substrate. In some embodiments, the first substrate 100 and the second substrate 200 may be coupled (e.g., connected and/or attached) to each other.

The first substrate 100 may be a display substrate including an array of pixels. Each pixel of the array of pixels may include a light emitting element to generate a light in response to a driving signal.

The second substrate 200 may be a color conversion substrate including a color conversion layer. The color conversion layer may be disposed in the display area DA. The color conversion layer may convert a wavelength of the light generated by the light emitting element of the first substrate 100. In addition, the second substrate 200 may further include a color filter layer to transmit a light having a set or specific color (e.g., a light having (e.g., a light within) a set or specific wavelength range).

The first substrate 100 and the second substrate 200 may be combined with each other by a sealing member 300. The sealing member 300 may be disposed in the peripheral area PA between the first substrate 100 and the second substrate 200. For example, the sealing member 300 may be disposed between the first substrate 100 and the second substrate 200 to be around (e.g., surround) the display area DA. For example, the sealing member 300 may have a hollow rectangular shape (e.g., a rectangular frame shape) in a plan view. For example, the sealing member 300 may have a line shape extending around (e.g., surrounding) the display area DA in the plan view. For example, the sealing member 300 may contact an upper surface of the first substrate 100 and a lower surface of the second substrate 200, and may combine the first substrate 100 and the second substrate 200 with each other. In some embodiments, the sealing member 300 may couple (e.g., connect or attach) the first substrate 100 and the second substrate 200 together.

A cell gap GP may be formed between the first substrate 100 and the second substrate 200. For example, the cell gap GP may be maintained by the sealing member 300 disposed between the first substrate 100 and the second substrate 200. For example, the cell gap GP may be encapsulated (e.g., encapsulated or surrounded on all sides) by the first substrate 100, the second substrate 200, and the sealing member 300.

Figure 4:
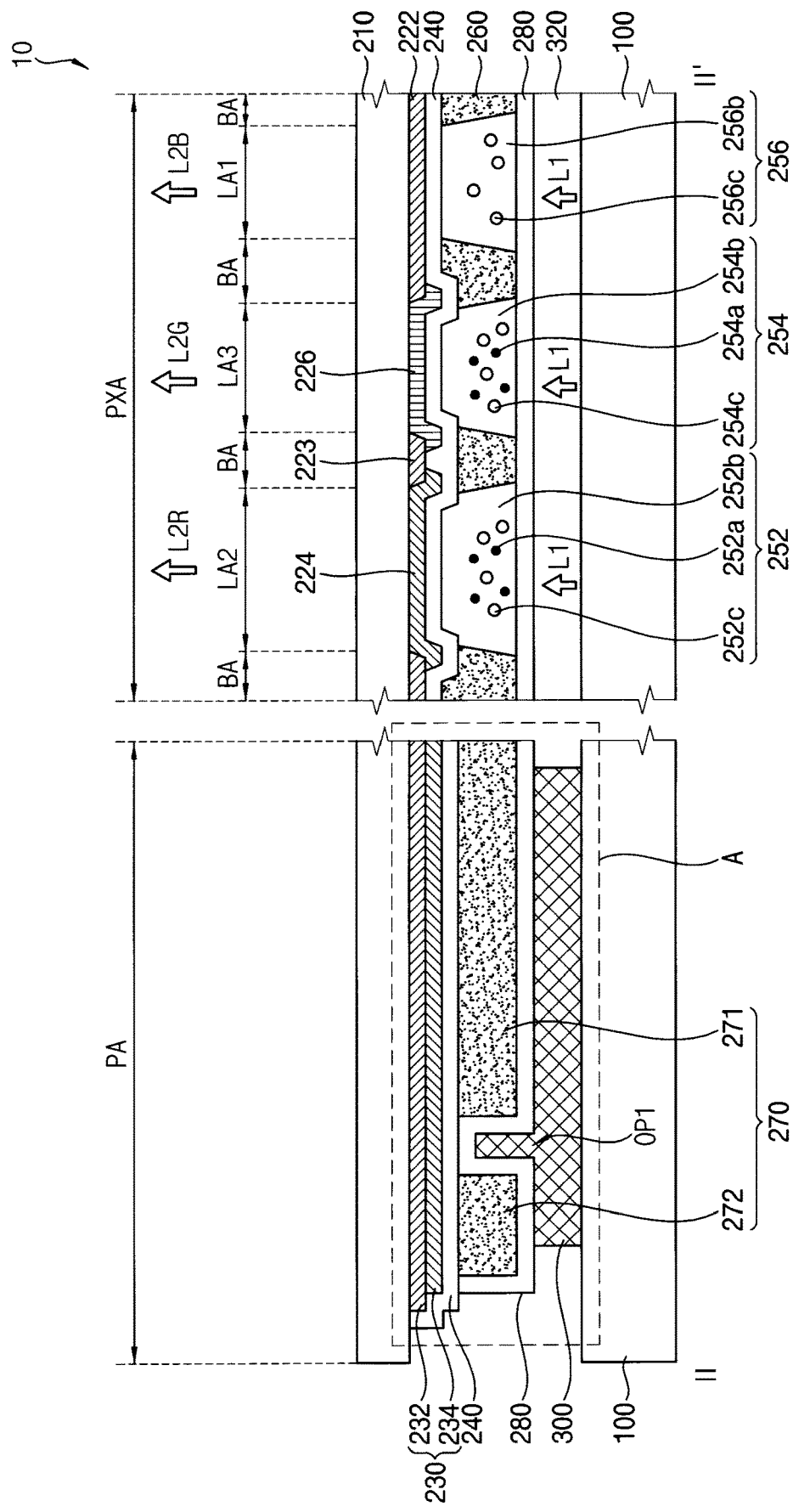
FIG. 4 is a cross-sectional view taken along line II-II' of FIG. 2.

FIG. 4 is a cross-sectional view taken along line II-II' of FIG. 2.

Referring to FIG. 4, in an embodiment, the second substrate 200 may include a first base substrate 210, a color filter layer, a light blocking layer 223, a functional layer 230, a first capping layer 240, a color conversion layer, a transmission layer 256, a partition wall 260, a compensation structure 270, and a second capping layer 280. For example, the color filter layer, the light blocking layer 223, the color conversion layer, the transmission layer 256, and the partition wall 260 may be disposed in the display area DA on the first base substrate 210. The functional layer 230 and the compensation structure 270 may be disposed in the peripheral area PA on the first base substrate 210. Hereinafter, the display area DA and the pixel area PXA included in the display area DA of the second substrate 200 will be described with reference to FIG. 4.

The first base substrate 210 may include the display area DA and the peripheral area PA. The display area DA may overlap the array of pixels included in the first substrate 100. The display area DA may include the pixel areas PXA. The peripheral area PA may be around (e.g., surround) the display area DA.

Each of the pixel areas PXA included in the display area DA may include at least one light emitting area and a light blocking area BA. The light generated by the light emitting element of the first substrate 100 may be emitted to an outside through the light emitting area. For example, the light emitting area may include a first light emitting area LA1, a second light emitting area LA2, and a third light emitting area LA3.

Transmitted lights having different colors may be emitted from the first to third light emitting areas LA1, LA2, and LA3, respectively. The light blocking area BA may be around (e.g., surround) the light emitting area.

When an incident light L1 emitted from the first substrate 100 is incident into the second substrate 200, first to third transmitted lights L2B, L2R, and L2G having different colors may be emitted from the first to third light emitting areas LA1, LA2, and LA3, respectively. For example, the incident light L1 may be blue light. The first transmitted light L2B emitted from the first light emitting area LA1 may be blue light. The second transmitted light L2R emitted from the second light emitting area LA2 may be red light. The third transmitted light L2G emitted from the third light emitting area LA3 may be green light.

The color filter layer may be disposed in the display area DA on the first base substrate 210. The color filter layer may include first to third color filter layers 222, 224, and 226. For example, the first color filter layer 222 may overlap the first light emitting area LA1 and may transmit blue light. The second color filter layer 224 may overlap the second light emitting area LA2 and may transmit red light. The third color filter layer 226 may overlap the third light emitting area LA3 and may transmit green light.

The light blocking layer 223 may be disposed in the display area DA on the first base substrate 210. The light blocking layer 223 may overlap the light blocking area BA. In an embodiment, the light blocking layer 223 may include (e.g., be) substantially the same material as that of the first color filter layer 222. For example, the light blocking layer 223 may be located in substantially the same layer as the first color filter layer 222. For example, the first color filter layer 222 and the light blocking layer 223 may be substantially simultaneously (or concurrently) formed utilizing (e.g., using) a same material. The light blocking layer 223 may be entirely disposed in the (e.g., disposed in the entire and/or disposed only in the) light blocking area BA. The light blocking layer 223 may prevent or reduce color mixing of the light emitting areas adjacent to each other.

The first capping layer 240 may be entirely disposed in the (e.g., disposed in the entire and/or disposed only in the) display area DA and the peripheral area PA on the first base substrate 210. For example, a portion of the first capping layer 240 disposed in the display area DA may cover the first to third color filter layers 222, 224, and 226 and the light blocking layer 223. Another portion of the first capping layer 240 disposed in the peripheral area PA may cover the functional layer 230.

The first capping layer 240 may include (e.g., be) an inorganic material such as silicon oxide, silicon nitride, and/or the like. For example, the first capping layer 240 may be disposed to have substantially the same thickness along the profiles of the first to third color filter layers 222, 224, and 226, the light blocking layer 223, and the functional layer 230.

The color conversion layer may be disposed in the display area DA on the first base substrate 210. The color conversion layer may change a wavelength of the incident light L1 to emit a transmitted light having a color different from a color of the incident light L1. In an embodiment, the color conversion layer may include a first color conversion layer 252 and a second color conversion layer 254.

The first color conversion layer 252 may overlap the second light emitting area LA2. The first color conversion layer 252 may include wavelength-converting particles 252a and a resin part 252b.

In an embodiment, each of the wavelength-converting particles 252a may include a quantum dot. The quantum dot may include (e.g., be or be defined as) a nano-crystalline semiconductor material. The quantum dot may absorb an incident light and emit a light having a wavelength different from a wavelength of the incident light.

For example, the quantum dot may have a diameter equal to or less than about 100 nm. In an embodiment, the quantum dot may have a diameter (e.g., an average particle size) of about 1 nm to about 20 nm. The average particle size may refer to a median size (D50) measured, for example, utilizing a laser diffraction particle diameter distribution meter. For example, each of the wavelength-converting particles 252a may include a quantum dot that is to absorb blue light and emit red light.

The wavelength-converting particles 252a may be disposed in the resin part 252b. For example, the resin part 252b may include (e.g., be) an epoxy resin, an acrylic resin, a phenolic resin, a melamine resin, a cardo resin, an imide resin, and/or the like.

In an embodiment, the first color conversion layer 252 may further include scattering particles 252c. The scattering particles 252c may scatter the incident light L1 without substantially changing the wavelength of the incident light L1. Therefore, a path of a light progressing in (e.g., progressing through) the first color conversion layer 252 may be increased. For example, the scattering particles 252c may include (e.g., be) a metal oxide and/or an organic material.

The first color conversion layer 252 may change the wavelength of the incident light L1 (e.g., blue incident light) to emit the second transmitted light L2R (e.g., red transmitted light). A remainder of the blue incident light L1, which is not color-changed in the first color conversion layer 252, may be blocked by the second color filter layer 224. Accordingly, the second light emitting area LA2 may selectively emit the red transmitted light L2R.

The second color conversion layer 254 may overlap the third light emitting area LA3. The second color conversion layer 254 may include wavelength-converting particles 254a, a resin part 254b, and scattering particles 254c. The resin part 254b may include (e.g., be) substantially the same material as that of the resin part 252b of the first color conversion layer 252. The scattering particles 254c may include (e.g., be) substantially the same material as that of the scattering particles 252c of the first color conversion layer 252.

In an embodiment, each of the wavelength-converting particles 254a may include a quantum dot that is to absorb blue light and emit green light. The second color conversion layer 254 may change the wavelength of the incident light L1 (e.g., blue incident light) to emit the third transmitted light L2G (e.g., green transmitted light).

A remainder of the blue incident light L1, which is not color-changed in the second color conversion layer 254, may be blocked by the third color filter layer 226. Accordingly, the third light emitting area LA3 may selectively emit the green transmitted light L2G.

The transmission layer 256 may overlap the first light emitting area LA1. In some embodiments, the transmission layer 256 does not convert the incident light L1, and may emit the first transmitted light L2B substantially the same as (e.g., substantially the same wavelength as) that of the incident light L1. For example, the transmission layer 256 may absorb a blue light and emit the blue light. The transmission layer 256 may include a resin part 256b and scattering particles 256c.

The resin part 256b may include (e.g., be) substantially the same material as that of the resin part 252b of the first color conversion layer 252. The scattering particles 256c may include (e.g., be) substantially the same material as that of the scattering particles 252c of the first color conversion layer 252.

The partition wall 260 may be disposed in the display area DA on the first base substrate 210. The partition wall 260 may be around (e.g., surround) side surfaces of the first color conversion layer 252, the second color conversion layer 254, and the transmission layer 256. In some embodiments, the partition wall 260 may have openings corresponding to the first color conversion layer 252, the second color conversion layer 254, and the transmission layer 256, respectively. Each of the first color conversion layer 252, the second color conversion layer 254, and the transmission layer 256 may be in a corresponding opening of the partition wall 260. The partition wall 260 may form a space (e.g., opening) to receive an ink composition for forming the first color conversion layer 252, the second color conversion layer 254, and the transmission layer 256. Accordingly, the partition wall 260 may have a grid shape or a matrix shape in a plan view.

For example, the partition wall 260 may include (e.g., be) an organic material such as a photoresist, an epoxy resin, a phenolic resin, an acrylic resin, a silicone resin, and/or the like. The partition wall 260 may further include (e.g., be) a light blocking material. For example, at least a portion of the partition wall 260 may include (e.g., be) the light blocking material such as a pigment, a dye, a carbon black, and/or the like. The partition wall 260 may entirely overlap the (e.g., overlap the entire and/or only overlap the) light blocking area BA.

The second capping layer 280 may be entirely disposed in the (e.g., disposed in the entire and/or disposed only in the) display area DA and the peripheral area PA on the first base substrate 210. For example, a portion of the second capping layer 280 disposed in the display area DA may cover the first and second color conversion layers 252 and 254, the transmission layer 256, and the partition wall 260.

Another portion of the second capping layer 280 disposed in the peripheral area PA may cover the compensation structure 270. In some embodiments, the other portion of the second capping layer 280 disposed in the peripheral area PA may further cover at least a portion of the first capping layer 240 (e.g., a portion of the first capping layer 240 exposed by the first opening OP1).

The second capping layer 280 may include (e.g., be) an inorganic material such as silicon oxide, silicon nitride, and/or the like. For example, the second capping layer 280 may be disposed to have substantially the same thickness along the profiles of the first and second color conversion layers 252 and 254, the transmission layer 256, the partition wall 260, and the compensation structure 270.

Figure 5:
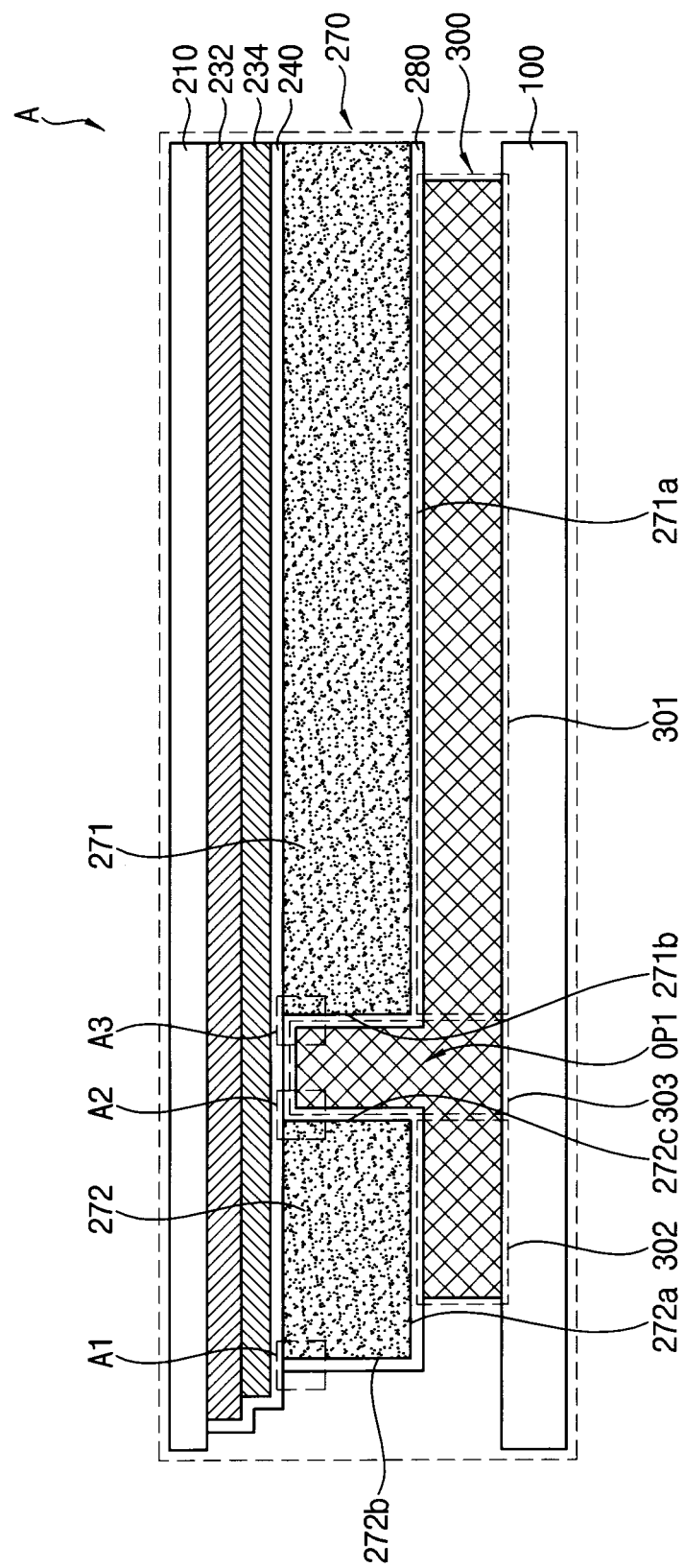
FIG. 5 is an enlarged view illustrating an example of area "A" of FIG. 4.
Figure 6:
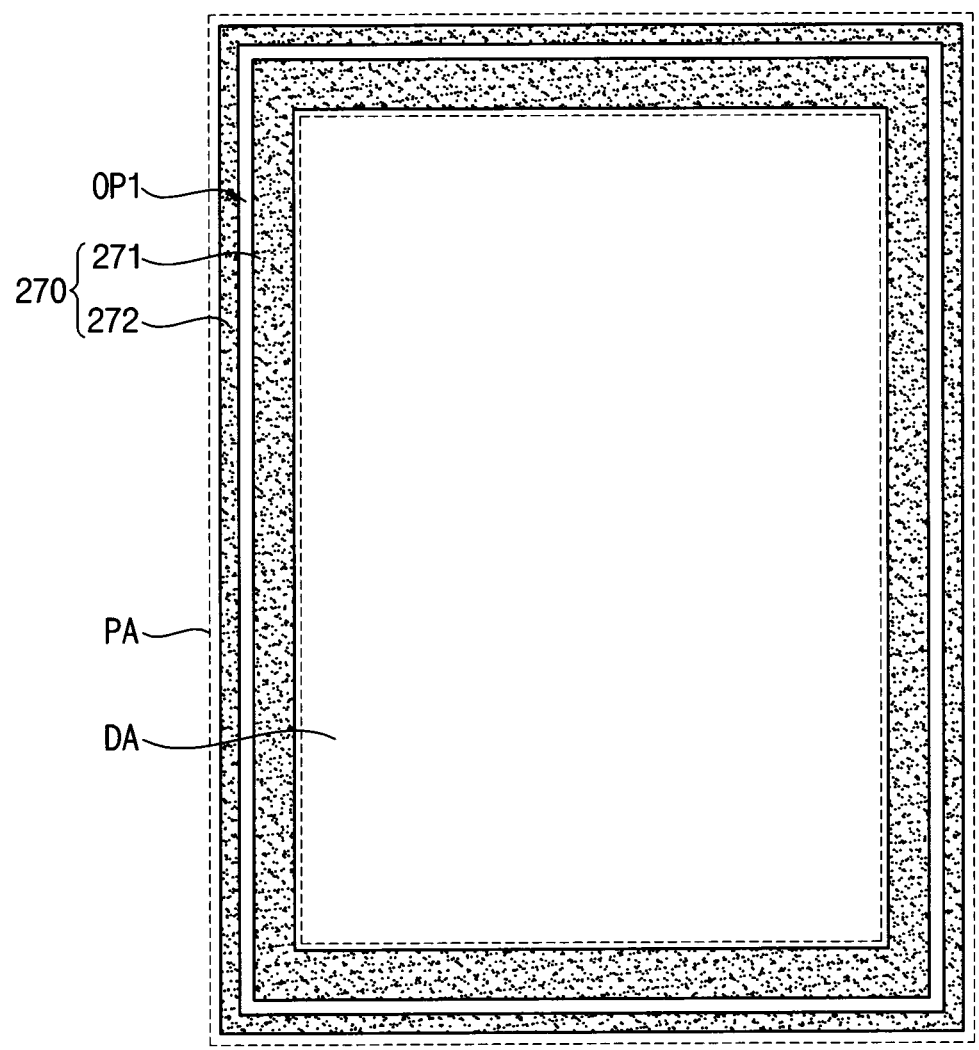
FIG. 6 is a plan view illustrating an example of a compensation structure included in the display device of FIG. 4.

FIG. 5 is an enlarged view illustrating an example of area "A" of FIG. 4. FIG. 6 is a plan view illustrating an example of a compensation structure included in the display device of FIG. 4.

Hereinafter, the peripheral area PA of the second substrate 200 will be described with reference to FIGS. 4 to 6.

Referring to FIGS. 4 to 6, the functional layer 230 may be disposed in the peripheral area PA on the first base substrate 210. The functional layer 230 may include (e.g., be) an organic material. For example, the functional layer 230 may include (e.g., be) a material having a low reflectance, and may prevent or reduce reflection of an external light incident into the first base substrate 210 (e.g., incident onto a surface of the functional layer 230 facing the first base substrate 210) from the outside. In some embodiments, the functional layer 230 may include (e.g., be) substantially the same material as that of the color filter layers. In some embodiments, the functional layer 230 may include (e.g., be) substantially the same material as that of one or more (e.g., two) of the color filter layers (e.g., the first and second color filter layers 222 and 224). In addition, the functional layer 230 may compensate for a step difference between the first substrate 100 and the first base substrate 210 together with the compensation structure 270. This will be described in more detail later. Optionally, the functional layer 230 may be omitted.

The functional layer 230 may have a single layer or a multilayer structure. For example, as illustrated in FIG. 4, the functional layer 230 may include an upper functional layer 232 and a lower functional layer 234. The upper functional layer 232 may include (e.g., be) substantially the same material as that of the first color filter layer 222. The lower functional layer 234 may include (e.g., be) substantially the same material as that of the second color filter layer 224. However, embodiments are not limited thereto, and the functional layer 230 may have a single layer structure or a multilayer structure of three or more layers. For example, the functional layer 230 may further include a low refractive index layer having a refractive index (index of refraction) less than a refractive index of the first base substrate 210. In some embodiments, the low refractive index layer may be an uppermost layer of the functional layer 230 that directly contacts the first base substrate 210.

A portion of the first capping layer 240 disposed in the peripheral area PA may cover the functional layer 230. For example, the first capping layer 240 may be disposed to have substantially the same thickness along the profile of the functional layer 230. The first capping layer 240 may prevent or reduce penetration of foreign substances such as oxygen, moisture, and/or the like into the functional layer 230.

The compensation structure 270 may be disposed in the peripheral area PA on the first base substrate 210. For example, the compensation structure 270 may be disposed under the functional layer 230 and the first capping layer 240. For example, the functional layer 230 may be disposed between the first base substrate 210 and the compensation structure 270. For example, an upper surface of the compensation structure 270 may directly contact a lower surface of the first capping layer 240.

The sealing member 300 may overlap (e.g., overlap in the plan view) the compensation structure 270. The compensation structure 270 may compensate for the step difference between the first substrate 100 and the first base substrate 210. In some embodiments, the first and second color conversion layers 252 and 254, the transmission layer 256, and the partition wall 260 may be disposed only in the display area DA on the first base substrate 210 and are not disposed in the peripheral area PA. Accordingly, the step difference may occur between the display area DA and the peripheral area PA between the first substrate 100 and the first base substrate 210. The compensation structure 270 may compensate for the step difference, so that a thickness (e.g., a thickness in up and down directions) and a width (e.g., a width in left and right directions) of the sealing member 300 disposed in the peripheral area PA between the first substrate 100 and the second substrate 200 may be reduced. In some embodiments, the width of the sealing member 300 may refer to a width along a horizontal direction in the plan view that is normal (e.g., perpendicular) to an extension direction (e.g., a primary extension direction) of the sealing member 300. Accordingly, a width of the peripheral area PA of the display device 10 may be reduced.

The compensation structure 270 may include (e.g., be) an organic material. For example, the compensation structure 270 may include (e.g., be) substantially the same material as that of the partition wall 260. For example, the compensation structure 270 may include (e.g., be) an organic material such as a photoresist, an epoxy resin, a phenolic resin, an acrylic resin, a silicone resin, and/or the like. The compensation structure 270 may further include (e.g., be) a light blocking material.

The compensation structure 270 may include a first compensation structure 271 and a second compensation structure 272 spaced apart from (e.g., spaced apart in the plan view from) the first compensation structure 271. A first opening OP1 may be formed between the first compensation structure 271 and the second compensation structure 272. The second compensation structure 272 may include (e.g., be) substantially the same material as that of the first compensation structure 271.

At least a portion of the first compensation structure 271, at least a portion of the second compensation structure 272, and the first opening OP1 may overlap the sealing member 300. For example, the sealing member 300 may continuously overlap the first compensation structure 271, the first opening OP1, and the second compensation structure 272. For example, as illustrated in FIG. 4, a portion of the sealing member 300 may be filled in (e.g., completely filled) the first opening OP1. For example, a protruding portion of the sealing member 300 may protrude between the first and second compensation structures 271 and 272, for example, in a cross-sectional view. For example, the protruding portion of the sealing member 300 may protrude upward from an upper surface of the sealing member 300 (e.g., a surface of the sealing member 300 facing the first base substrate 210) to be between the first and second compensation structures 271 and 272.

For example, as illustrated in FIG. 6, the first compensation structure 271 may be disposed in the peripheral area PA on the first base substrate 210. The first compensation structure 271 may be around (e.g., surround) the display area DA. For example, the first compensation structure 271 may have a hollow rectangular shape (e.g., a rectangular frame shape) in a plan view. For example, the first compensation structure 271 may have a line shape extending around (e.g., surrounding) the display area DA in the plan view.

The second compensation structure 272 may be disposed in the peripheral area PA on the first base substrate 210. The second compensation structure 272 may be spaced apart from (e.g., spaced apart in the plan view from) the first compensation structure 271, and may be around (e.g., surround) the first compensation structure 271 in a plan view. For example, the second compensation structure 272 may have a hollow rectangular shape (e.g., a rectangular frame shape) in a plan view. In some embodiments, a width (e.g., a width in left and right directions) of the second compensation structure 272 may be less than a width of the first compensation structure 271. In some embodiments, the width of the first and second compensation structures 271 and 272 may refer to a width along a horizontal direction in the plan view that is normal (e.g., perpendicular) to an extension direction (e.g., a primary extension direction) of the first and second compensation structures 271 and 272, respectively. In some embodiments, the second compensation structure 272 may have a line shape extending around (e.g., surrounding) the first compensation structure 271 in the plan view.

The first opening OP1 may be formed between the first compensation structure 271 and the second compensation structure 272. The first opening OP1 may be located in the peripheral area PA. The first opening OP1 may be spaced apart from (e.g., spaced apart in the plan view from) the display area DA, and may be around (e.g., surround) the display area DA in a plan view. For example, the first opening OP1 may have a hollow rectangular shape (e.g., a rectangular frame shape) in a plan view. In some embodiments, the first opening OP1 may be between the first and second compensation structures 271 and 272 in the plan view. For example, the first opening OP1 may have a line shape extending around (e.g., surrounding) the first compensation structure 271 in the plan view, and the second compensation structure 272 may have a line shape extending around (e.g., surrounding) the first opening OP1 in the plan view.

A portion of the second capping layer 280 disposed in the peripheral area PA may cover the compensation structure 270. For example, the second capping layer 280 may continuously cover the first and second compensation structures 271 and 272. For example, the second capping layer 280 may be disposed to have substantially the same thickness along the profile of the first and second compensation structures 271 and 272.

For example, as illustrated in FIG. 5, the second capping layer 280 may cover a lower surface 271a of the first compensation structure 271 facing the first substrate 100, a lower surface 272a of the second compensation structure 272 facing the first substrate 100, and a lower surface of the first capping layer 240 overlapping (e.g., exposed by) the first opening OP1. The second capping layer 280 may further cover an outer side surface 271b of the first compensation structure 271 (e.g., a side surface of the first compensation structure 271 facing away from the display area DA in the plan view) adjacent to the second compensation structure 272. The second capping layer 280 may further cover an inner side surface 272c of the second compensation structure 272 (e.g., a side surface of the second compensation structure 272 facing the display area DA in the plan view) adjacent to the first compensation structure 271 and an outer side surface 272b of the second compensation structure 272 (e.g., a side surface of the second compensation structure 272 facing away from the display area DA in the plan view) opposite to the inner side surface 272c. For example, the second capping layer 280 may cover the side surfaces of the compensation structure 270 forming the first opening OP1. The second capping layer 280 may prevent or reduce penetration of foreign substances such as oxygen, moisture, and/or the like into the first and second compensation structures 271 and 272 from the outside.

As described above, the sealing member 300 may overlap at least a portion of the first compensation structure 271, at least a portion of the second compensation structure 272, and the first opening OP1. For example, as illustrated in FIG. 5, the sealing member 300 may include a first portion 301 overlapping the first compensation structure 271, a second portion 302 overlapping the second compensation structure 272, and a third portion 303 overlapping the first opening OP1. For example, a width (e.g., a width in left and right directions) of the third portion 303 may be less than a width of the first portion 301 or a width of the second portion 302.

In some embodiments, the width of the first, second, and third portions 301, 302, and 303 may refer to a width along a horizontal direction in the plan view that is normal (e.g., perpendicular) to an extension direction (e.g., a primary extension direction) of the first, second, and third portions 301, 302, and 303, respectively.

In an embodiment, the sealing member 300 may directly contact a lower surface of the second capping layer 280 and an upper surface of the first substrate 100. For example, the sealing member 300 may include (e.g., be) a frit. For another example, the sealing member 300 may include (e.g., be) a photocurable material. Optionally, the sealing member 300 may further include (e.g., be) a material for preventing or blocking moisture permeation.

In some embodiments, the second capping layer 280 may expose a portion of a side surface of the first compensation structure 271 and/or a portion of a side surface of the second compensation structure 272. For example, the closer to the first base substrate 210, the outer side surface 271b of the first compensation structure 271, the outer side surface 272b of the second compensation structure 272, and/or the inner side surface 272c of the second compensation structure 272 may not be sufficiently covered by the second capping layer 280. For example, unlike the example illustrated in FIG. 5, the second capping layer 280 may expose portions A1, A2, and A3 of the first and second compensation structure 271 and 272 adjacent to the first base substrate 210. For example, the second capping layer 280 may expose a portion of the outer side surface 271b of the first compensation structure 271, a portion of the outer side surface 272b of the second compensation structure 272, and/or a portion of the inner side surface 272c of the second compensation structure 272 that contacts a layer directly above the compensation structure 270 (e.g., the first capping layer 240). In this case, foreign substances such as moisture may penetrate into an inside of the first compensation structure 271 and/or an inside of the second compensation structure 272 from the outside through the exposed portions A1, A2, and A3.

In a related art display device (a display device of the related art), an opening (e.g., an opening comparable to the first opening OP1) is not formed in a compensation structure. Accordingly, as a portion of an outer side surface of the compensation structure is exposed, foreign substances such as moisture may penetrate into an inside of the compensation structure from the outside. Accordingly, a capping layer (e.g., a capping layer comparable to the second capping layer 280) and/or a sealing member may be entirely peeled off from the (e.g., peeled off from the entire) compensation structure. Accordingly, adhesion between an upper substrate and a lower substrate may be reduced.

However, as illustrated in FIG. 5, the display device 10 according to an embodiment may include the first compensation structure 271 and the second compensation structure 272 spaced apart from the first compensation structure 271. The first opening OP1 may be formed between the first compensation structure 271 and the second compensation structure 272. Therefore, even if the portion A1 of the second compensation structure 272 is exposed by the second capping layer 280 and the foreign substances such as moisture penetrate into the inside of the second compensation structure 272 from the outside, the foreign substances may not directly penetrate into the inside of the first compensation structure 271. For example, in order for the foreign substances to penetrate into the inside of the first compensation structure 271, the foreign substances must further pass the exposed portion A2 of the second compensation structure 272 opposite the exposed portion A1, the first opening OP1 filled (e.g., completely filled) with the portion of the sealing member 300, and the exposed portion A3 of the first compensation structure 271. In addition, as described above, the width of the first compensation structure 271 may be greater than the width of the second compensation structure 272. Accordingly, penetration of the foreign substances into the inside of the first compensation structure 271 having a relatively large width may be prevented or reduced. Accordingly, it is possible to prevent or reduce the second capping layer 280 and/or the sealing member 300 from peeling off from the first compensation structure 271 having the relatively large width. Accordingly, adhesion between the first substrate 100 and the second substrate 200 may be improved, and reliability of the display device 10 may be improved.

Figure 7:
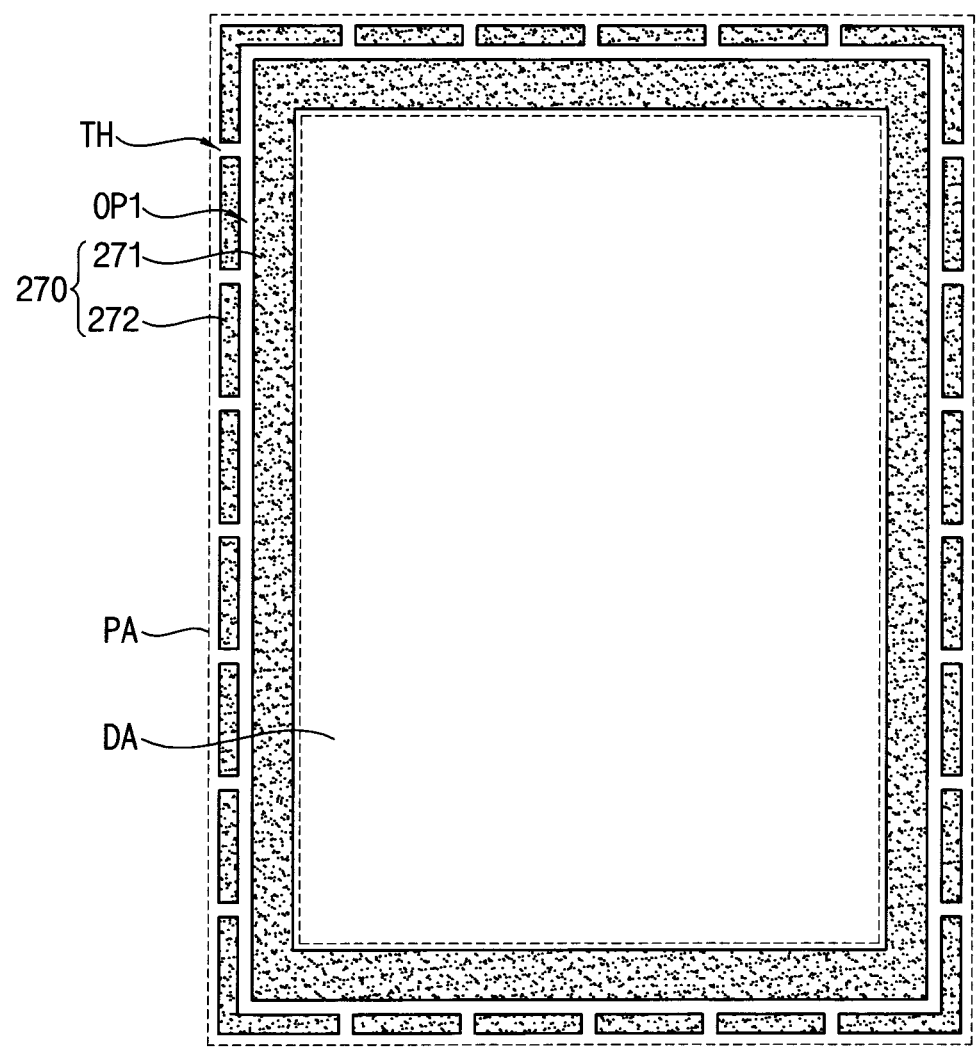
FIG. 7 is a plan view illustrating another example of a compensation structure included in the display device of FIG. 4.

FIG. 7 is a plan view illustrating another example of a compensation structure included in the display device of FIG. 4.

Referring to FIG. 7, in an embodiment, at least one through hole TH may be formed in the second compensation structure 272. For example, the through hole TH may be formed to penetrate the second compensation structure 272 along a direction normal (e.g., perpendicular) to a direction in which the second compensation structure 272 extends. For example, the through hole TH may provide a channel in the second compensation structure 272 extending through the width of the second compensation structure 272. The through hole TH may expose a portion of the first compensation structure 271. The through hole TH may couple (e.g., connect) the first opening OP1 and an outside of the second compensation structure 272. In some embodiments, in the process of disposing the sealing member 300 to overlap the first compensation structure 271, the second compensation structure 272, and the first opening OP1, foreign substances such as air and/or moisture may be located in the first opening OP1. For example, when the sealing member 300 is spread along the peripheral area PA, the foreign substances such as air may remain in the first opening OP1. The through hole TH may discharge the foreign substances remaining in the first opening OP1 to the outside of the second compensation structure 272. In an embodiment, the through hole TH may be provided in plurality as necessary.

Figure 8:
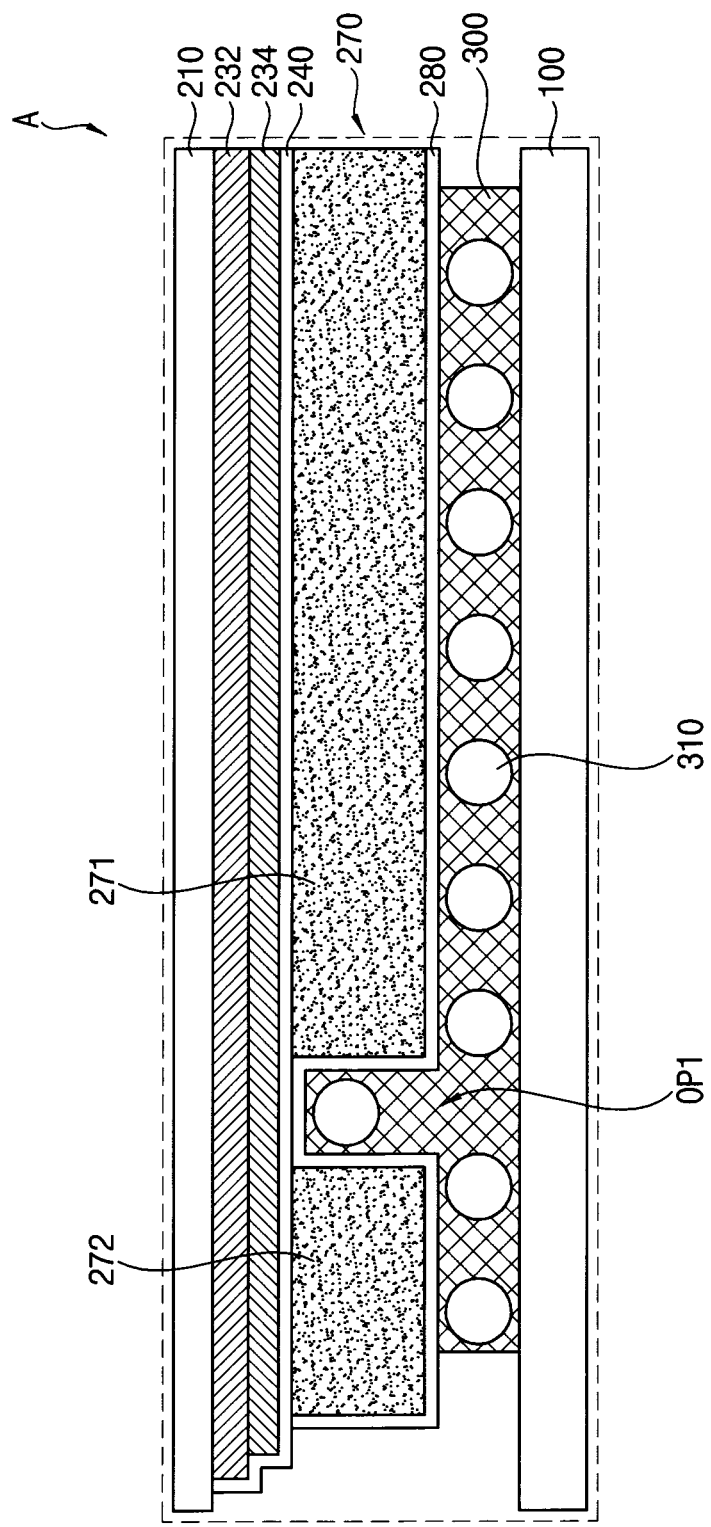
FIG. 8 is an enlarged view illustrating another example of area "A" of FIG. 4.

FIG. 8 is an enlarged view illustrating another example of area "A" of FIG. 4.

Referring to FIGS. 4, 5, and 8, in an embodiment, the sealing member 300 may include spacer particles 310. For example, each of the spacer particles 310 may include (e.g., be) an inorganic material such as silicon oxide, silicon nitride, and/or the like. A size (e.g., breadth, diameter, and/or volume) or average size of each of the spacer particles 310 may vary depending on a size of the cell gap GP to be formed. As described above, the width of the third portion 303 of the sealing member 300 may be less than the width of the first portion 301 or the width of the second portion 302. Accordingly, the cell gap GP between the first substrate 100 and the second substrate 200 may be sufficiently maintained.

Figure 9:
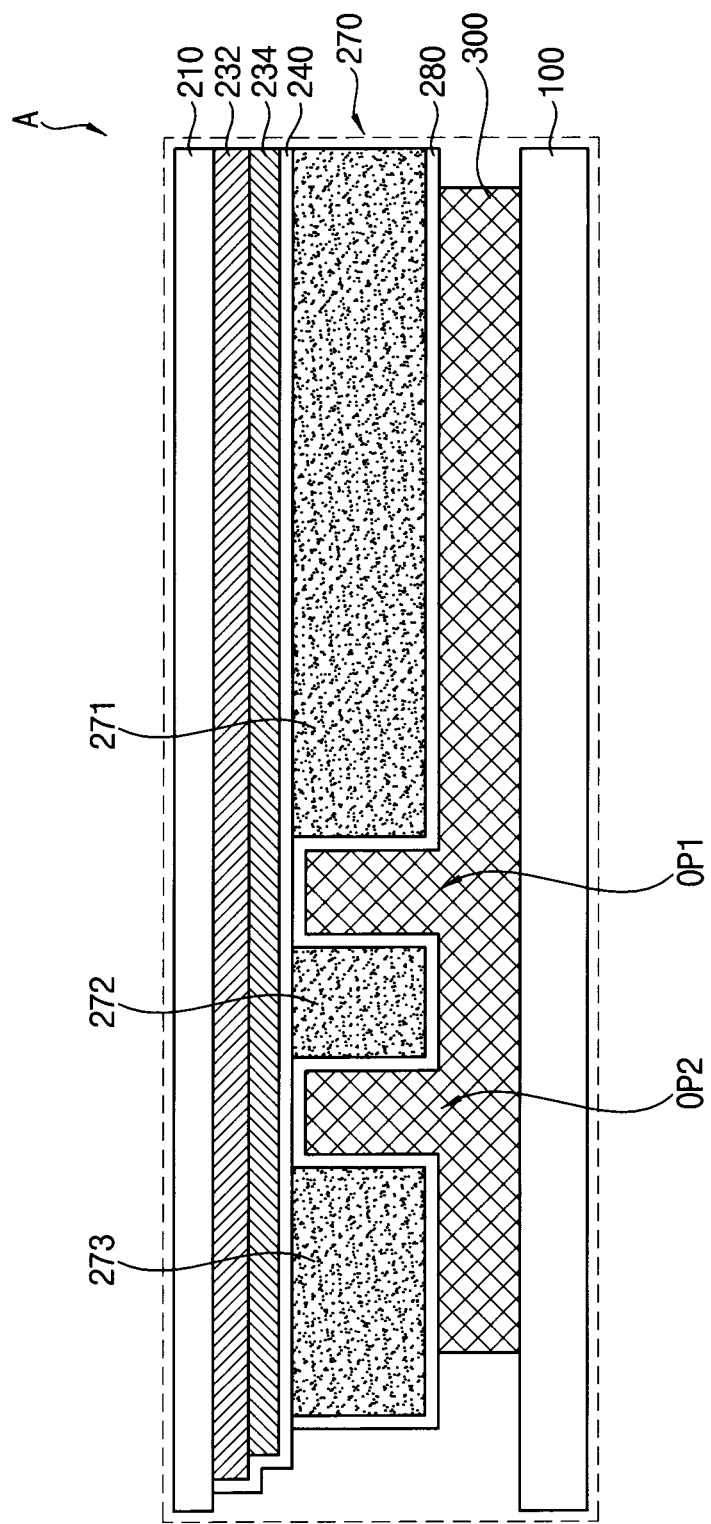
FIG. 9 is an enlarged view illustrating still another example of area "A" of FIG. 4.
Figure 10:
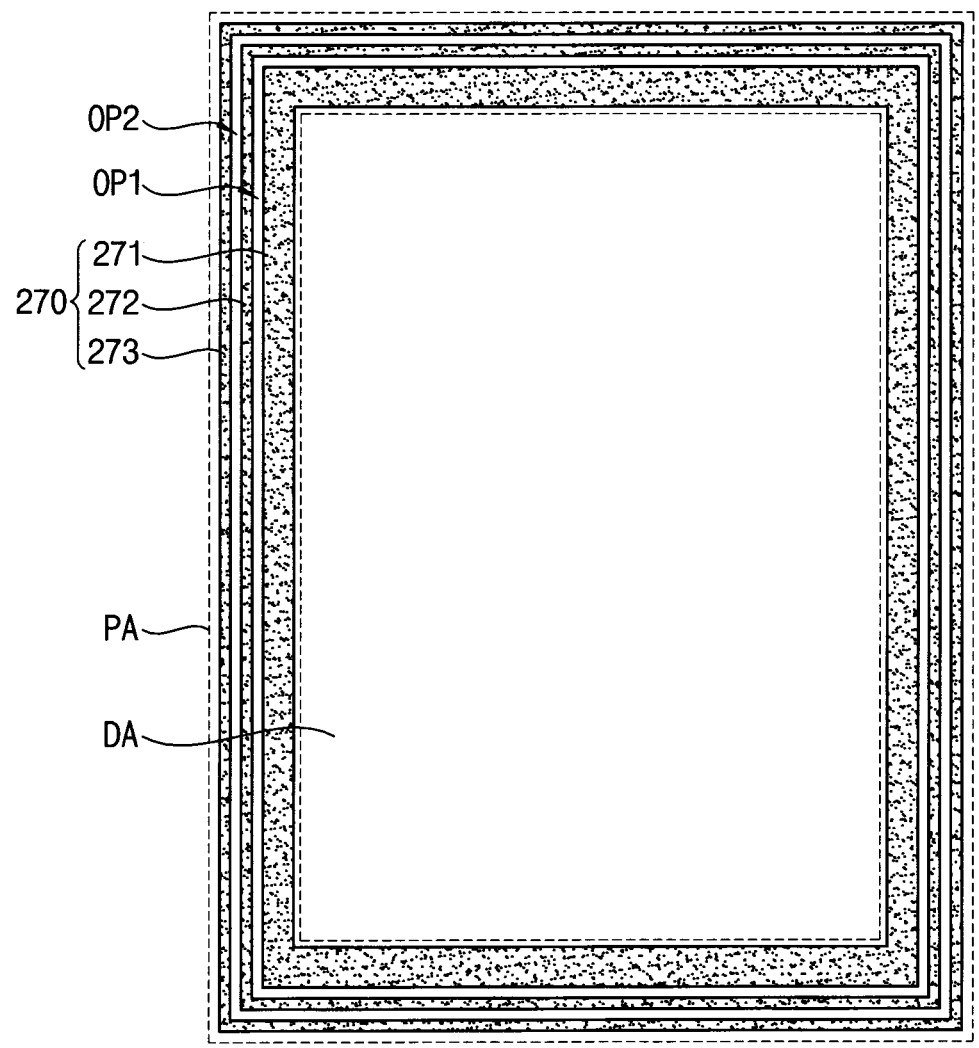
FIG. 10 is a plan view illustrating still another example of a compensation structure included in the display device of FIG. 4.

FIG. 9 is an enlarged view illustrating still another example of area "A" of FIG. 4. FIG. 10 is a plan view illustrating still another example of a compensation structure included in the display device of FIG. 4. For example, FIG. 10 may be a plan view of the compensation structure 270 of FIG. 9.

Referring to FIGS. 9 and 10, in an embodiment, the compensation structure 270 may further include a third compensation structure 273 spaced apart from the first and second compensation structures 271 and 272.

The third compensation structure 273 may be disposed in the peripheral area PA on the first base substrate 210. The third compensation structure 273 may be spaced apart from the second compensation structure 272, and may be around (e.g., surround) the second compensation structure 272 in a plan view. For example, the third compensation structure 273 may have a hollow rectangular shape (e.g., a rectangular frame shape) in a plan view. For example, the third compensation structure 273 may have a line shape extending around (e.g., surrounding) the second compensation structure 272 in the plan view. For example, a width (e.g., a width in left and right directions) of the third compensation structure 273 may be less than a width of the first compensation structure 271. In some embodiments, the width of the third compensation structure 273 may refer to a width along a horizontal direction in the plan view that is normal (e.g., perpendicular) to an extension direction (e.g., a primary extension direction) of the third compensation structure 273.

A second opening OP2 may be formed between the second compensation structure 272 and the third compensation structure 273. The second opening OP2 may be spaced apart from (e.g., spaced apart in the plan view from) the first opening OP1, and may be around (e.g., surround) the first opening OP1 in a plan view. For example, the second opening OP2 may have a hollow rectangular shape (e.g., a rectangular frame shape) in a plan view. For example, the second opening OP2 may have a line shape extending around (e.g., surrounding) the second compensation structure 272. When the third compensation structure 273 spaced apart from the second compensation structure 272 is further included (the second opening OP2 is further formed), foreign substances penetrating into the inside of the first compensation structure 271 from the outside may be further reduced.

At least a portion of the third compensation structure 273 and the second opening OP2 may overlap the sealing member 300. For example, the sealing member 300 may continuously overlap the first compensation structure 271, the first opening OP1, the second compensation structure 272, the second opening OP2, and the third compensation structure 273. For example, portions of the sealing member 300 may be filled in (e.g., completely filled) the first opening OP1 and the second opening OP2, respectively. For example, a protruding portion of the sealing member 300 may extend between the second and third compensation structures 272 and 273 in the second opening OP2. The third compensation structure 273 may include (e.g., be) substantially the same material as that of the first compensation structure 271 and the second compensation structure 272.

FIGS. 11 to 16 are cross-sectional views illustrating a method of manufacturing a display device according to an embodiment. For example, FIGS. 11 to 16 may illustrate a method of manufacturing the display device 10 according to an embodiment described with reference to FIGS. 4 to 6. Therefore, repeated descriptions may not be provided.

Figure 11:
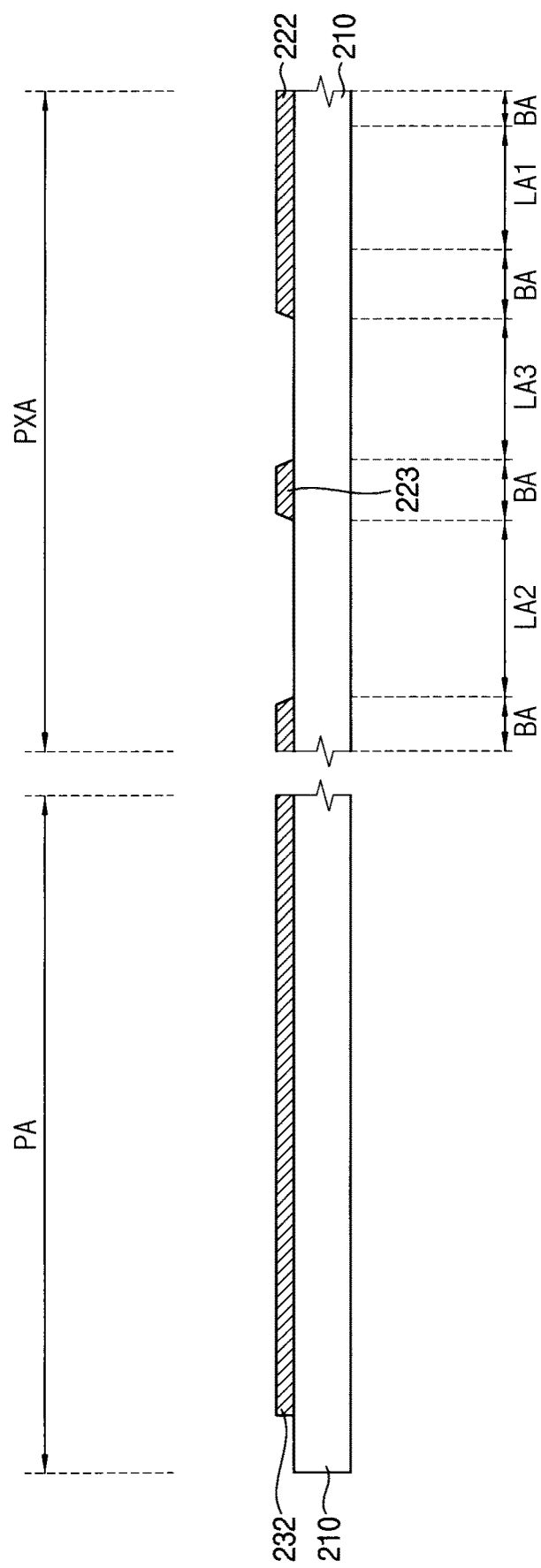
FIGS. 11-16 are cross-sectional views illustrating a method of manufacturing a display device according to an embodiment.

Referring to FIG. 11, the first color filter layer 222, the light blocking layer 223, and the upper functional layer 232 may be formed on the first base substrate 210.

The first color filter layer 222 may be formed in the display area DA on the first base substrate 210. In more detail, the first color filter layer 222 may be formed to overlap the first light emitting area LA1 included in each pixel area PXA. For example, the first color filter layer 222 may be formed of an organic polymer material including (e.g., being) a blue pigment.

The light blocking layer 223 may be formed in the display area DA on the first base substrate 210. In more detail, the light blocking layer 223 may be formed to overlap the light blocking area BA included in each pixel area PXA. For example, the light blocking layer 223 may be formed of an organic polymer material including (e.g., being) a blue pigment.

The upper functional layer 232 may be formed in the peripheral area PA on the first base substrate 210. For example, the upper functional layer 232 may be formed of an organic polymer material including (e.g., being) a blue pigment.

In an embodiment, the first color filter layer 222, the light blocking layer 223, and the upper functional layer 232 may be substantially simultaneously (or concurrently) formed. For example, an organic layer may be formed of an organic polymer material including (e.g., being) a blue pigment, and the organic layer may be patterned by a photolithography and/or the like to substantially simultaneously (or concurrently) form the first color filter layer 222, the light blocking layer 223, and the upper functional layer 232.

Figure 12:
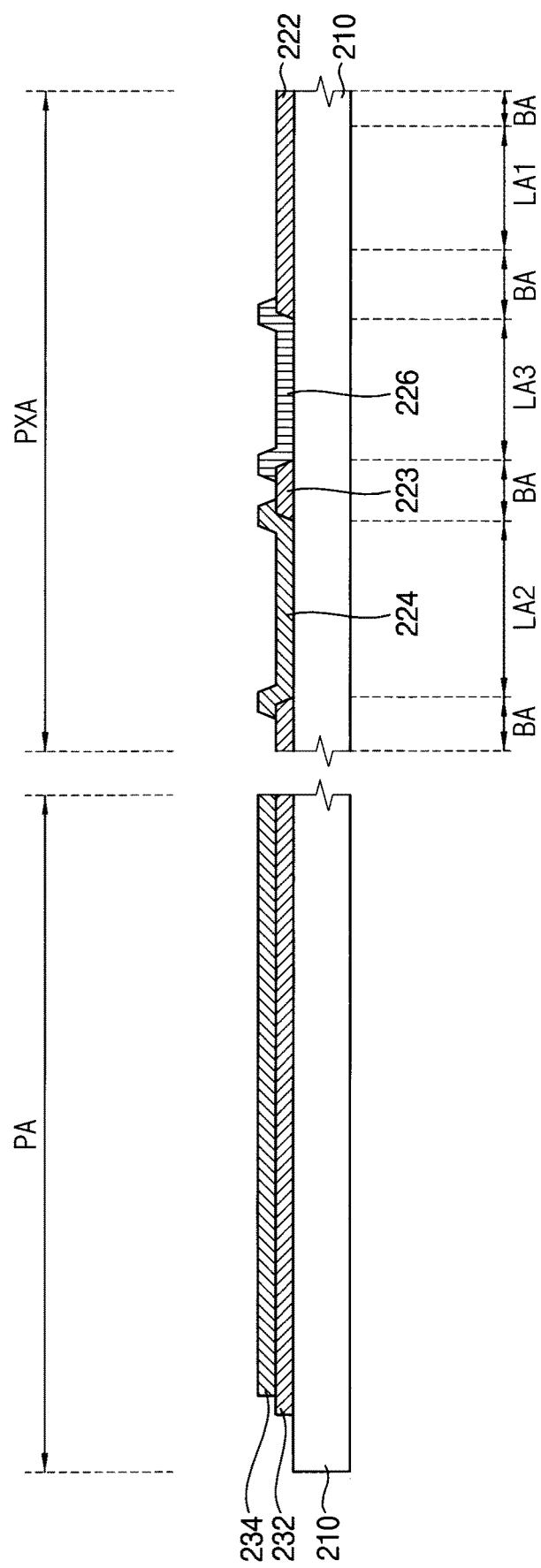

Referring to FIG. 12, the second color filter layer 224 and the lower functional layer 234 may be formed on the first base substrate 210. The second color filter layer 224 may be formed in the display area DA on the first base substrate 210. In more detail, the second color filter layer 224 may be formed to overlap the second light emitting area LA2 included in each pixel area PXA. For example, the second color filter layer 224 may be formed of an organic polymer material including (e.g., being) a red pigment.

The lower functional layer 234 may be formed in the peripheral area PA on the first base substrate 210. For example, the lower functional layer 234 may be formed of an organic polymer material including (e.g., being) a red pigment.

In an embodiment, the second color filter layer 224 and the lower functional layer 234 may be substantially simultaneously (or concurrently) formed. For example, an organic layer may be formed of an organic polymer material including (e.g., being) a red pigment, and the organic layer may be patterned by a photolithography and/or the like to substantially simultaneously (or concurrently) form the second color filter layer 224 and the lower functional layer 234.

Subsequently, the third color filter layer 226 may be formed on the first base substrate 210, but the present disclosure is not limited thereto. For example, the third color filter layer 226 may be formed before the second color filter layer 224 and the lower functional layer 234 are formed. The third color filter layer 226 may be formed in the display area DA on the first base substrate 210. In more detail, the third color filter layer 226 may be formed to overlap the third light emitting area LA3 included in each pixel area PXA. For example, the third color filter layer 226 may be formed of an organic polymer material including (e.g., being) a green pigment. In addition, in some embodiments, a functional layer including (e.g., being) substantially the same material as that of the third color filter layer 226 may be further formed in the peripheral area PA on the first base substrate 210.

Figure 13:
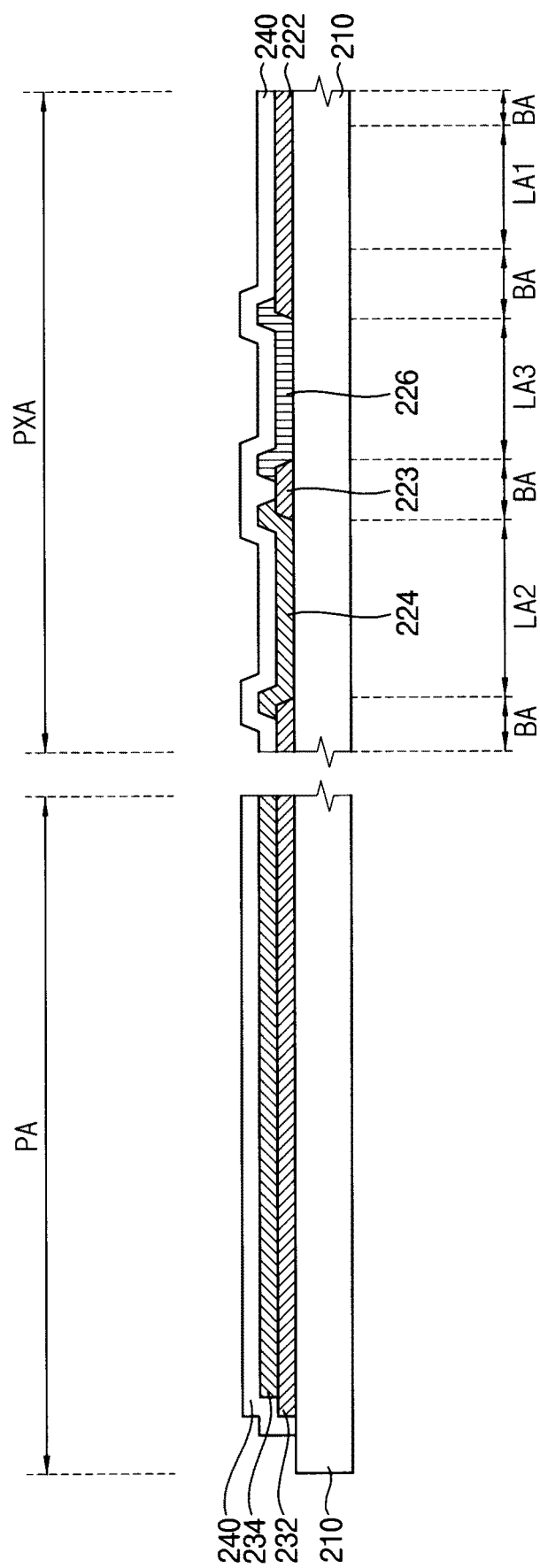

Referring to FIG. 13, the first capping layer 240 may be formed on the first base substrate 210. The first capping layer 240 may be entirely formed in the (e.g., formed in the entire and/or formed only in the) display area DA and the peripheral area PA on the first base substrate 210.

The first capping layer 240 may include (e.g., be) an inorganic material such as silicon oxide, silicon nitride, and/or the like. The first capping layer 240 may cover the first to third color filter layers 222, 224, 226, the light blocking layer 223, and the functional layer 230. For example, the first capping layer 240 may be formed to have substantially the same thickness along the profiles of the first to third color filter layers 222, 224, 226, the light blocking layer 223, and the functional layer 230.

Figure 14:
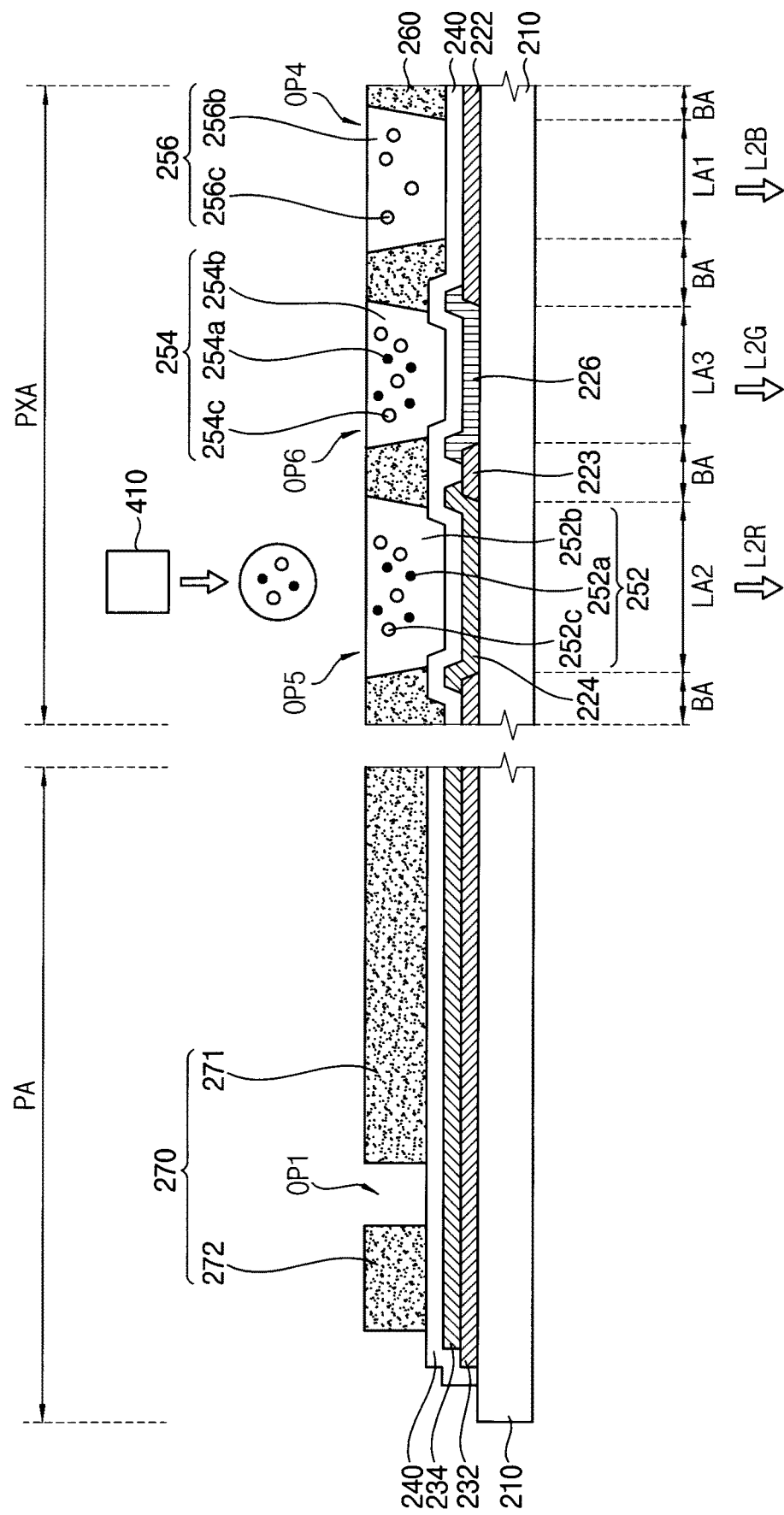

Referring to FIG. 14, the partition wall 260, the first compensation structure 271, and the second compensation structure 272 may be formed on the first base substrate 210. The partition wall 260 may be formed in the display area DA on the first base substrate 210. In more detail, partition wall 260 may be formed on the first base substrate 210 to entirely overlap the (e.g., to overlap the entire and/or to only overlap the) light blocking area BA included in each pixel area PXA. For example, the partition wall 260 may be formed of an organic polymer material including (e.g., being) a black pigment.

The partition wall 260 may be formed to expose each of the first to third light emitting areas LA1, LA2, and LA3 in each pixel area PXA. For example, fourth to sixth openings OP4, OP5, and OP6 respectively overlapping each of the first to third light emitting regions LA1, LA2, and LA3 may be formed in the partition wall 260.

The first and second compensation structures 271 and 272 may be formed in the peripheral area PA on the first base substrate 210. For example, the first compensation structure 271 may be formed to be around (e.g., surround) the display area DA in a plan view. The second compensation structure 272 may be formed to be spaced apart from the first compensation structure 271 and to be around (e.g., surround) the first compensation structure 271 in a plan view. Accordingly, the first opening OP1 may be formed between the first compensation structure 271 and the second compensation structure 272. Each of the first and second compensation structures 271 and 272 may be formed to have a substantially flat upper surface (e.g., an upper surface of each of the first and second compensation structures 271 and 272 as shown in FIG. 14, for example, a surface facing away from the first base substrate 210). For example, the first and second compensation structures 271 and 272 may be formed of an organic polymer material including (e.g., being) a black pigment.

In an embodiment, the partition wall 260, the first compensation structure 271, and the second compensation structure 272 may be substantially simultaneously (or concurrently) formed. For example, an organic layer may be formed of an organic polymer material including (e.g., being) a black pigment, and the organic layer may be patterned by a photolithography and/or the like to substantially simultaneously (or concurrently) form the partition wall 260, the first compensation structure 271, and the second compensation structure 272.

Subsequently, the first color conversion layer 252, the second color conversion layer 254, and the transmission layer 256 may be formed on the first base substrate 210. The first color conversion layer 252, the second color conversion layer 254, and the transmission layer 256 may be formed in the display area DA on the first base substrate 210. In more detail, the first color conversion layer 252 may be formed to overlap the second light emitting area LA2 in each pixel area PXA, the second color conversion layer 254 may be formed to overlap the third light emitting area LA3 in each pixel area PXA, and the transmission layer 256 may be formed to overlap the first light emitting area LA1 in each pixel area PXA.

In an embodiment, the first color conversion layer 252, the second color conversion layer 254, and the transmission layer 256 may be formed by an inkjet process. For example, an ink including (e.g., being) corresponding composition (e.g., corresponding wavelength-converting particles) may be provided in the fourth to sixth openings OP4, OP5, and OP6 formed in the display area DA. An inkjet printing apparatus may be utilized (e.g., used) to provide the ink. The inkjet printing apparatus may include a head including a plurality of nozzles 410. The inkjet printing apparatus may provide the ink inside the fourth to sixth openings OP4, OP5, and OP6 through the plurality of nozzles 410. Accordingly, the fourth to sixth openings OP4, OP5, and OP6 may be filled with the corresponding composition. The compositions in the fourth to sixth openings OP4, OP5, and OP6 may be cured to form the first color conversion layer 252, the second color conversion layer 254, and the transmission layer 256. For example, the compositions may be cured my heat and/or light.

Figure 15:
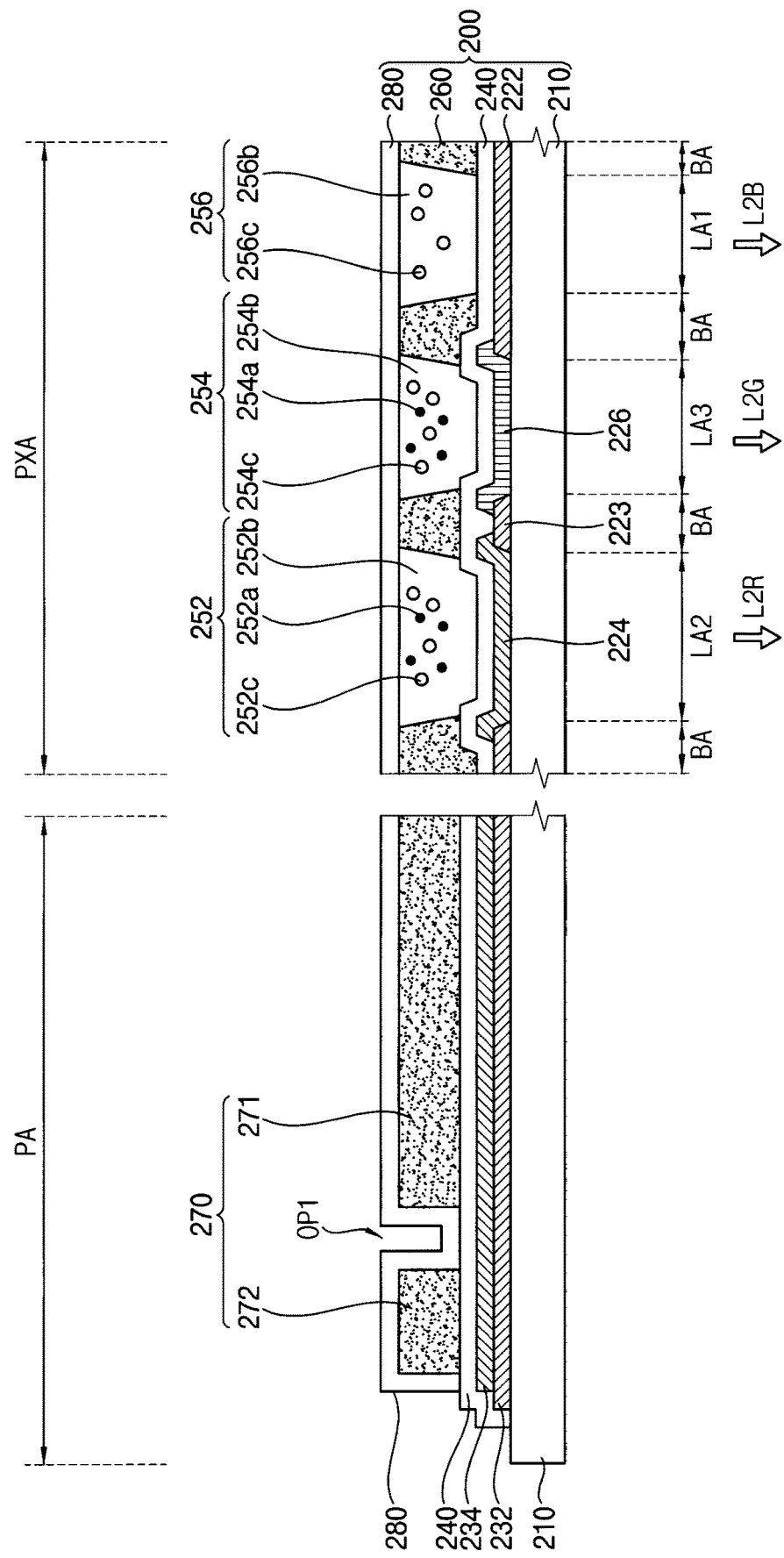

Referring to FIG. 15, the second capping layer 280 may be formed on the first base substrate 210. The second capping layer 280 may be entirely formed in the (e.g., formed in the entire and/or formed only in the) display area DA and the peripheral area PA on the first base substrate 210.

The second capping layer 280 may include (e.g., be) an inorganic material such as silicon oxide, silicon nitride, and/or the like. The second capping layer 280 may cover the first and second color conversion layers 252 and 254, the transmission layer 256, the partition wall 260, the first compensation structure 271, and the second compensation structure 272. For example, the second capping layer 280 may be formed to have substantially the same thickness along the profiles of the first and second color conversion layers 252 and 254, the transmission layer 256, the partition wall 260, the first compensation structure 271, and the second compensation structure 272. In some embodiments, the second capping layer 280 may further be formed in the first opening OP1, for example, on a surface of the first capping layer 240 exposed by the first opening OP1 and on part or all of the side surfaces of the compensation structure 270 forming the first opening OP1.

Figure 16:
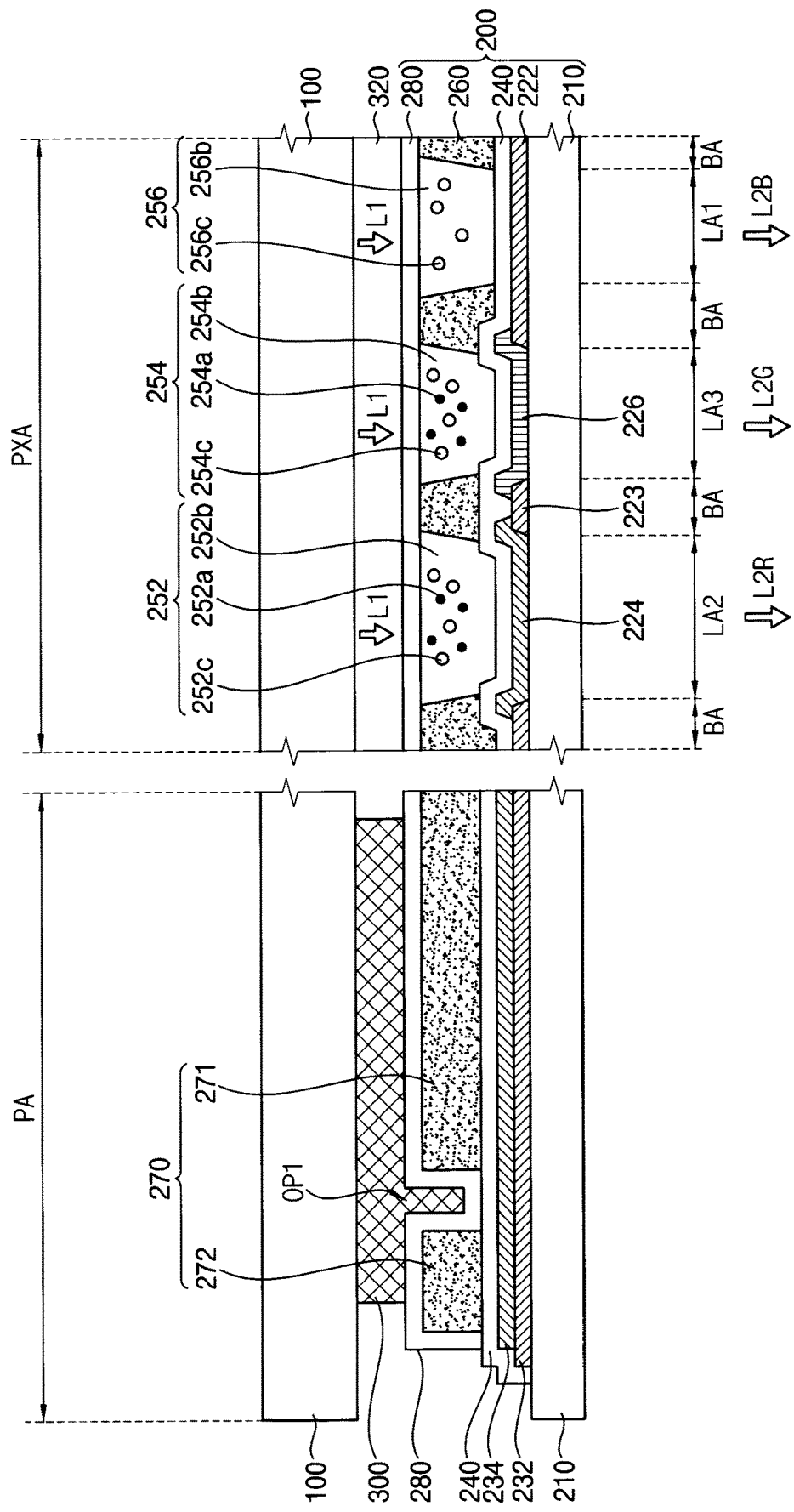

Referring to FIG. 16, the first substrate 100 and the second substrate 200 may be combined with each other by the sealing member 300. The sealing member 300 may be disposed in the peripheral area PA between the first substrate 100 and the second substrate 200. For example, the sealing member 300 may overlap at least a portion of the first compensation structure 271, at least a portion of the second compensation structure 272, and the first opening OP1. A portion of the sealing member 300 may be filled in the first opening OP1.

A filling member 320 may be disposed between the first substrate 100 and the second substrate 200. The filling member 320 may include (e.g., be) an organic material such as a silicone resin, an epoxy resin, and/or the like. In addition, the filling member 320 may include (e.g., be) an appropriate and/or suitable material for matching a refractive index. For example, a refractive index of the filling member 320 may match (e.g., be substantially the same as) a refractive index of the first substrate 100 and/or a refractive index of the second capping layer 280.

Figure 17:
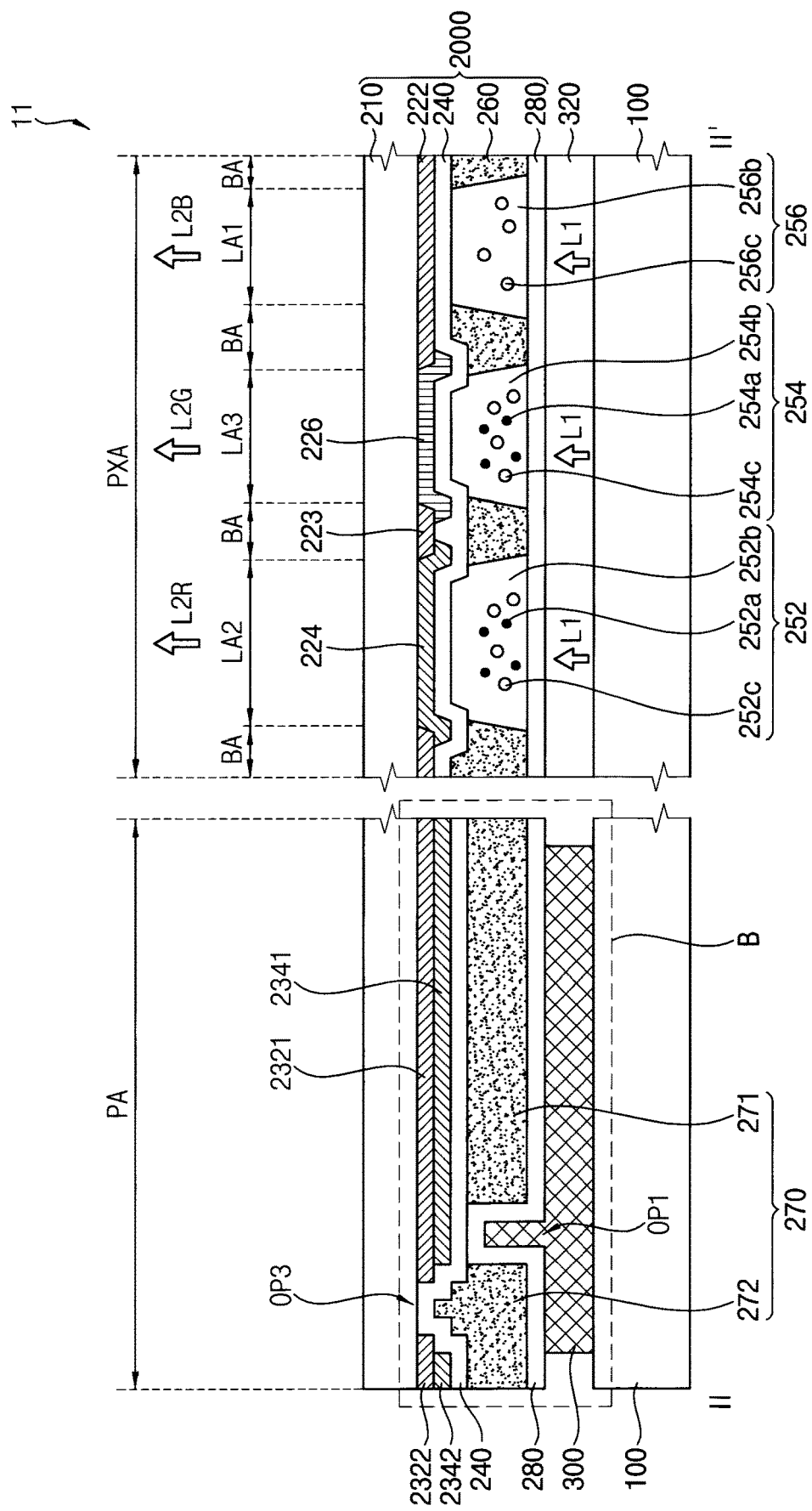
FIG. 17 is a cross-sectional view illustrating a display device according to another embodiment.
Figure 18:
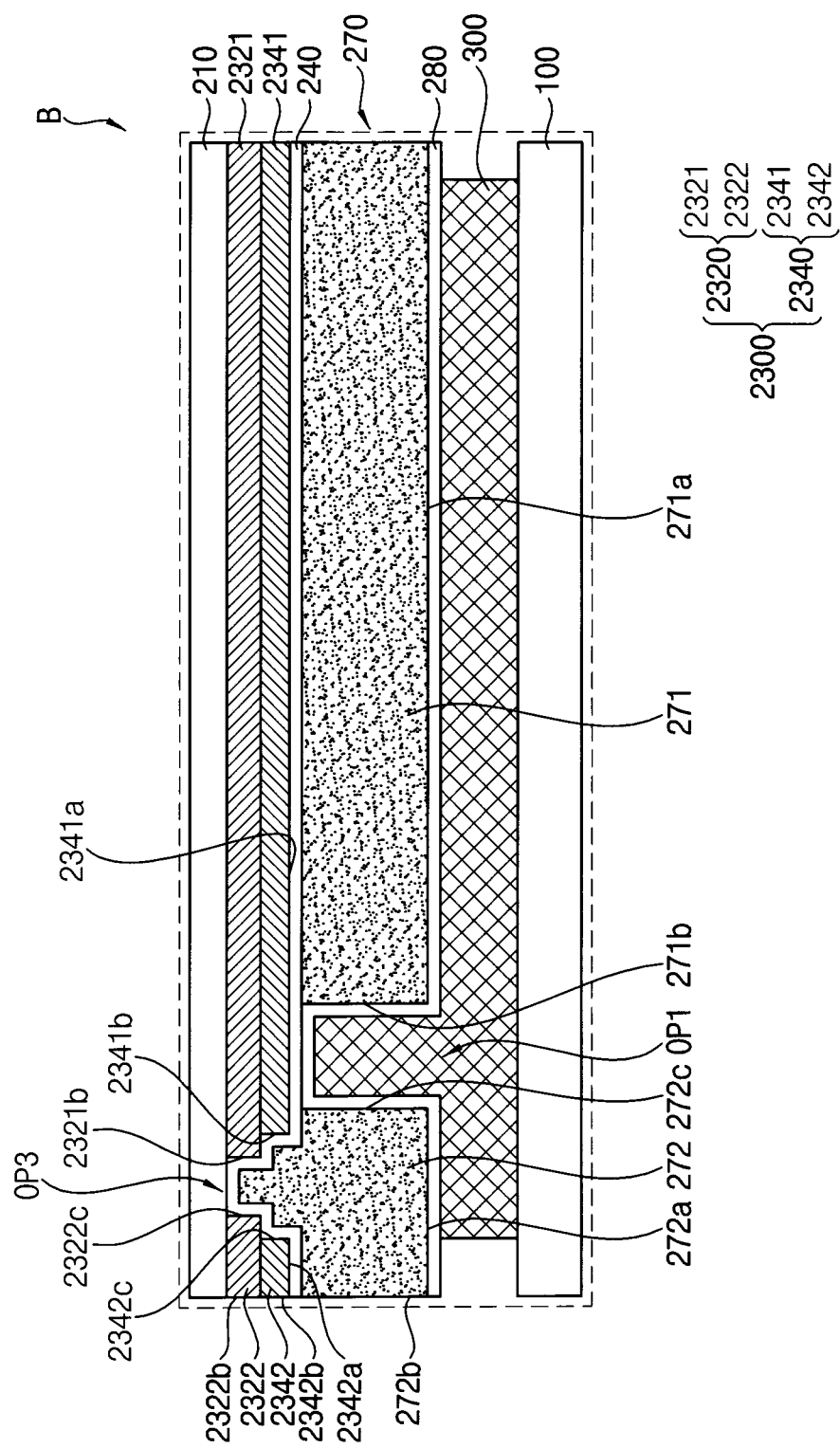
FIG. 18 is an enlarged view illustrating an area "B" of FIG. 17.

FIG. 17 is a cross-sectional view illustrating a display device according to another embodiment. FIG. 18 is an enlarged view illustrating an area "B" of FIG. 17.

Referring to FIGS. 17 and 18, a display device 11 according to another embodiment may include a first substrate 100, a second substrate 2000, and a sealing member 300. The second substrate 2000 may include a first base substrate 210, first to third color filter layers 222, 224, and 226, a light blocking layer 223, a functional layer 2300, and a first capping layer 240, first and second color conversion layers 252 and 254, a transmission layer 256, a partition wall 260, a compensation structure 270, and a second capping layer 280. The display device 11 according to the other embodiment may be substantially the same as or similar to the display device 10 according to the embodiment described with reference to FIGS. 4 to 6 except for the functional layer 2300. Therefore, repeated descriptions may not be provided.

The functional layer 2300 may disposed in the peripheral area PA on the first base substrate 210. The functional layer 2300 may include (e.g., be) an organic material, and may prevent or reduce reflection of an external light incident into the first base substrate 210 from the outside.

The functional layer 2300 may have a single layer or a multilayer structure. For example, the functional layer 2300 may include an upper functional layer 2320 and a lower functional layer 2340. The upper functional layer 2320 may include (e.g., be) substantially the same material as that of the first color filter layer 222. The lower functional layer 2340 may include (e.g., be) substantially the same material as that of the second color filter layer 224. However, embodiments are not limited thereto, and the functional layer 2300 may have a single layer structure or a multilayer structure of three or more layers.

The upper functional layer 2320 may include a first upper functional layer 2321 and a second upper functional layer 2322 spaced apart from (e.g., spaced apart in the plan view from) the first upper functional layer 2321. A third opening OP3 may be formed between the first upper functional layer 2321 and the second upper functional layer 2322. the first upper functional layer 2321 may be disposed in the peripheral area PA on the first base substrate 210. The first upper functional layer 2321 may be around (e.g., surround) the display area DA. For example, the first upper functional layer 2321 may have a hollow rectangular shape (e.g., a rectangular frame shape) in a plan view. For example, the first upper functional layer 2321 may have a line shape extending around (e.g., surrounding) the display area DA.

The second upper functional layer 2322 may be disposed in the peripheral area PA on the first base substrate 210. The second upper functional layer 2322 may be spaced apart from the first upper functional layer 2321, and may be around (e.g., surround) the first upper functional layer 2321 in a plan view. For example, the second upper functional layer 2322 may have a hollow rectangular shape (e.g., a rectangular frame shape) in a plan view. For example, the second upper functional layer 2322 may have a line shape extending around (e.g., surrounding) the first upper functional layer 2321. For example, a width (e.g., a width in left and right directions) of the second upper functional layer 2322 may be less than a width of the first upper functional layer 2321. In some embodiments, the width of the first and second upper functional layers 2321 and 2322 may refer to a width along a horizontal direction in the plan view that is normal (e.g., perpendicular) to an extension direction (e.g., a primary extension direction) of the first and second upper functional layers 2321 and 2322, respectively.

The third opening OP3 may be formed between the first upper functional layer 2321 and the second upper functional layer 2322. The third opening OP3 may be located in the peripheral area PA. The third opening OP3 may be spaced apart from the display area DA, and may be around (e.g., surround) the display area DA in a plan view. For example, the third opening OP3 may have a hollow rectangular shape (e.g., a rectangular frame shape) in a plan view. For example, the third opening OP3 may have a line shape extending around (e.g., surrounding) the first upper functional layer 2321. For example, as illustrated in FIG. 18, the third opening OP3 may overlap the first compensation structure 271. For another example, the third opening OP3 may overlap the first opening OP1 and/or the second compensation structure 272.

The lower functional layer 2340 may include a first lower functional layer 2341 and a second lower functional layer 2342 spaced apart from (e.g., spaced apart in the plan view from) the first lower functional layer 2341. The first lower functional layer 2341 may overlap the first upper functional layer 2321, and the second lower functional layer 2342 may overlap the second upper functional layer 2322. For example, the lower functional layer 2340 may have substantially the same or similar shape as the upper functional layer 2320 in a plan view. The lower functional layer 2340 may expose the third opening OP3. The first upper functional layer 2321 and the first lower functional layer 2341 may be referred as first functional layers, and the second upper functional layer 2322 and the second lower functional layer 2342 may be referred as second functional layers.

A portion of the first capping layer 240 disposed in the peripheral area PA may cover the functional layer 2300. For example, the first capping layer 240 may be disposed to have substantially the same thickness along the profile of the functional layer 2300.

For example, as illustrated in FIG. 18, the first capping layer 240 may cover a lower surface 2341a of the first lower functional layer 2341 facing the first substrate 100, a lower surface 2342a of the second lower functional layer 2342 facing the first substrate 100, and a lower surface of the first base substrate 210 overlapping the third opening OP3.

In an embodiment, the first capping layer 240 may expose outer side surfaces 2322b and 2342b of the second functional layers 2322 and 2342 (e.g., side surfaces of the second functional layers 2322 and 2342 facing away from the display area DA in the plan view). For example, in a manufacturing process of the display device 11, as an outer portion of the second substrate 2000 is cut along a cutting line (e.g., a cutting line SL of FIG. 24) located in the peripheral area PA, the first capping layer 240 may expose the outer side surfaces 2322b and 2342b of the second functional layers 2322 and 2342. In this case, foreign substances such as moisture may penetrate into an inside of the second functional layers 2322 and 2342 from the outside through the outer side surfaces 2322b and 2342b.

The first capping layer 240 may entirely cover an (e.g., cover an entire and/or cover only an) inner side surface of the third opening OP3. For example, the first capping layer 240 may cover outer side surfaces 2321b and 2341b of the first functional layers 2321 and 2341 adjacent to the second functional layers 2322 and 2342 (e.g., side surfaces of the first functional layers 2321 and 2341 facing away from the display area DA in the plan view). The first capping layer 240 may further cover inner side surfaces 2322c and 2342c of the second functional layers 2322 and 2342 adjacent to the first functional layers 2321 and 2341 (e.g., side surfaces of the second functional layers 2322 and 2342 facing the display area DA in the plan view). Accordingly, the first capping layer 240 may prevent or reduce penetration of the foreign substances into an inside of the first functional layers 2321 and 2341 from the inside of the second functional layers 2322 and 2342.

FIGS. 19 to 25 are cross-sectional views illustrating a method of manufacturing a display device according to another embodiment. For example, FIGS. 19 to 25 may illustrate a method of manufacturing the display device 11 according to the other embodiment described with reference to FIGS. 17 and 18. Repeated descriptions with respect to the method of manufacturing the display device 10 according to an embodiment described with reference to FIGS. 11 to 16 may not be provided.

Figure 19:
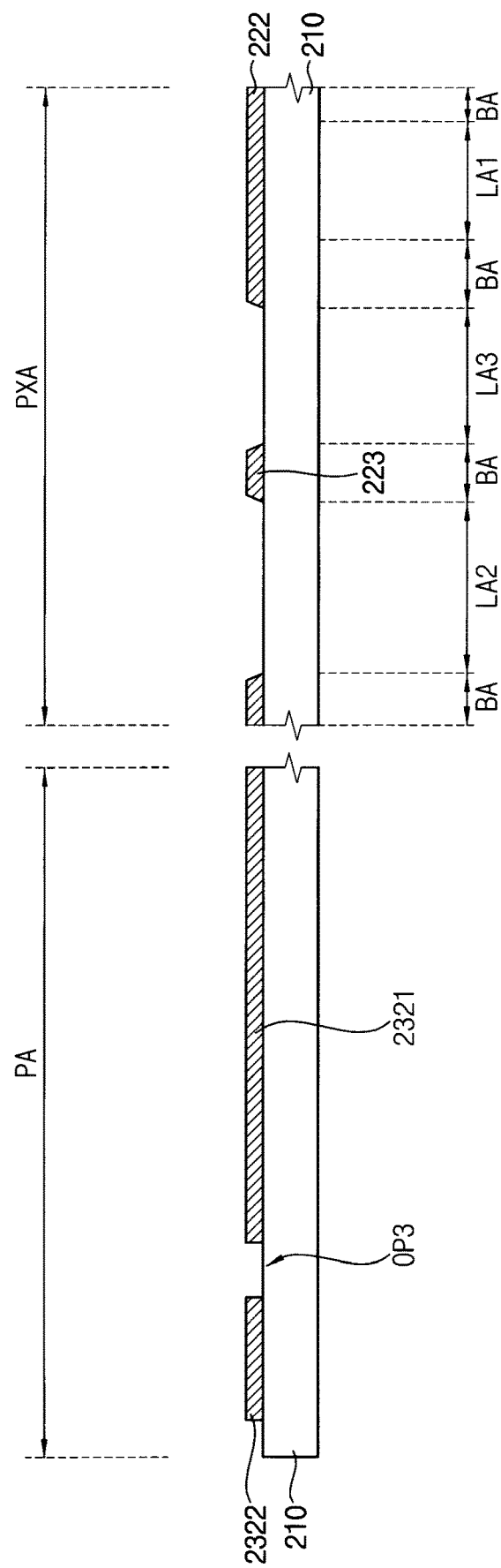
FIGS. 19-25 are cross-sectional views illustrating a method of manufacturing a display device according to another embodiment.

Referring to FIG. 19, the first color filter layer 222, the light blocking layer 223, the first upper functional layer 2321, and the second upper functional layer 2322 may be formed on the first base substrate 210. The first and the second upper functional layers 2321 and 2322 may be formed in the peripheral area PA on the first base substrate 210. For example, the first upper functional layer 2321 may be formed to be around (e.g., surround) the display area DA in a plan view. The second upper functional layer 2322 may be formed to be spaced apart from the first upper functional layer 2321 and to be around (e.g., surround) the first upper functional layer 2321 in a plan view. Accordingly, the third opening OP3 may be formed between the first upper functional layer 2321 and the second upper functional layer 2322. In an embodiment, the first color filter layer 222, the light blocking layer 223, the first upper functional layer 2321, and the second upper functional layer 2322 may be substantially simultaneously (or concurrently) formed.

Figure 20:
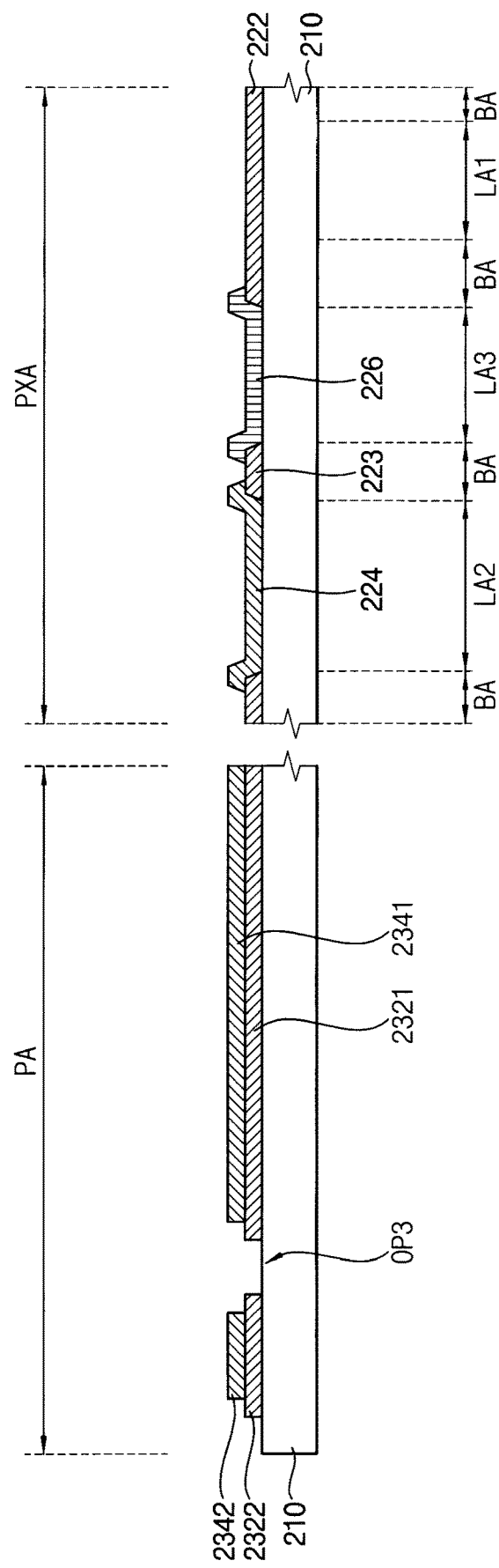

Referring to FIG. 20, the second color filter layer 224, the first lower functional layer 2341, and the second lower functional layer 2342 may be formed on the first base substrate 210. The first and the second lower functional layers 2341 and 2342 may be formed in the peripheral area PA on the first base substrate 210. For example, the first lower functional layer 2341 may be formed to overlap the first upper functional layer 2321, and the second lower functional layer 2342 may be formed to overlap the second upper functional layer 2322. The first and the second lower functional layers 2341 and 2342 may expose the third opening OP3. In an embodiment, the second color filter layer 224, the first lower functional layer 2341, and the second lower functional layer 2342 may be substantially simultaneously (or concurrently) formed. The third color filter layer 226 may also be formed on the first base substrate 210.

Figure 21:
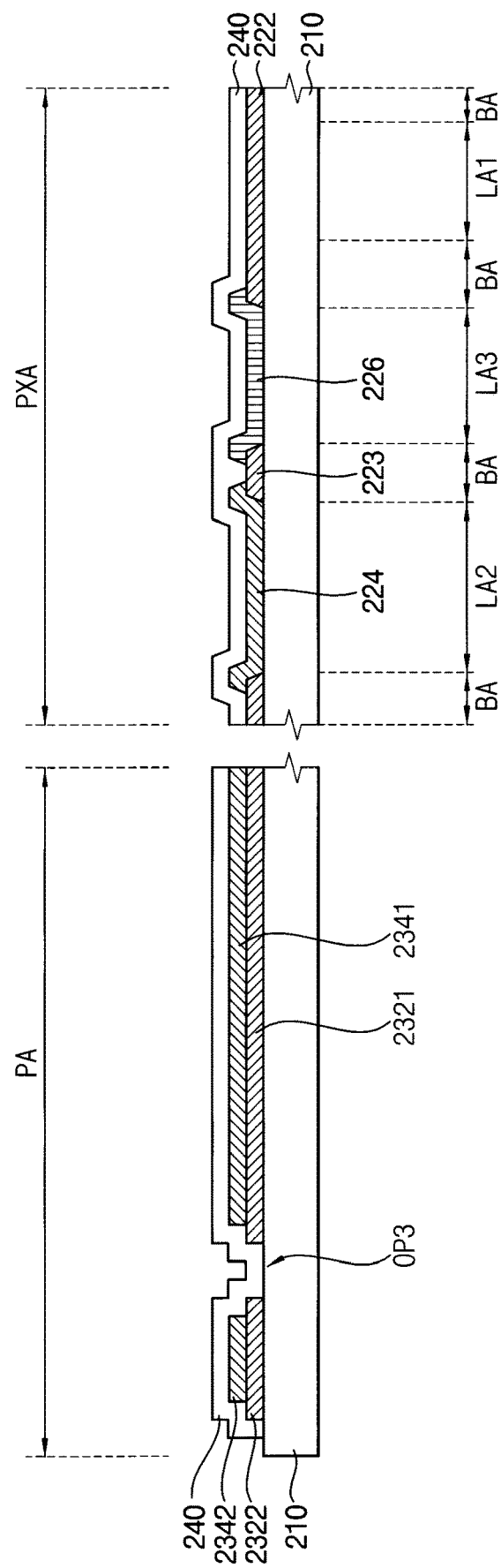

Referring to FIG. 21, the first capping layer 240 may be formed on the first base substrate 210. The first capping layer 240 may be entirely formed in the (e.g., formed in the entire and/or formed only in the) display area DA and the peripheral area PA on the first base substrate 210. The first capping layer 240 may cover the first to third color filter layers 222, 224, 226, the light blocking layer 223, the first upper functional layer 2321, the second upper functional layer 2322, the first lower functional layer 2341, and the second lower functional layer 2342. For example, the first capping layer 240 may be formed to have substantially the same thickness along the profiles of the first to third color filter layers 222, 224, 226, the light blocking layer 223, the first upper functional layer 2321, the second upper functional layer 2322, the first lower functional layer 2341, and the second lower functional layer 2342.

Figure 22:
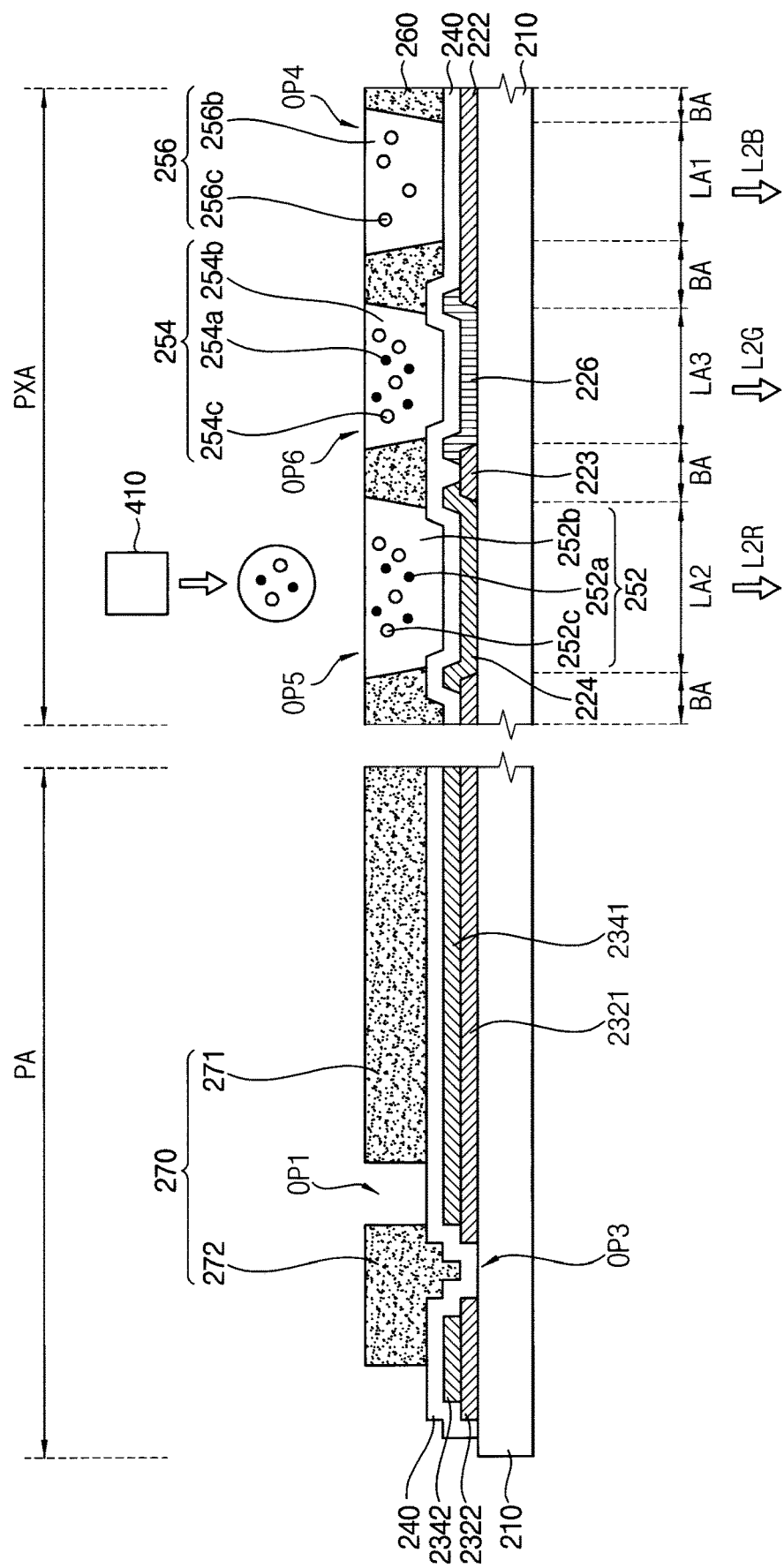

Referring to FIG. 22, the partition wall 260, the first and the second compensation structures 271 and 272, the first and the second color conversion layers 252 and 254, and the transmission layer 256 may be formed on the first base substrate 210. The first opening OP1 may be formed between the first compensation structure 271 and the second compensation structure 272. A portion of the second compensation structure 272 may be located in the third opening OP3. For example, a protruding portion of the second compensation structure 272 may extend between the second and second lower functional layers 2341 and 2342, and the protruding portion may also extend between the first and second upper functional layers 2321 and 2322. Each of the first and second compensation structures 271 and 272 may be formed to have a substantially flat upper surface (e.g., an upper surface of each of the first and second compensation structures 271 and 272 as shown in FIG. 22, for example, a surface facing away from the first base substrate 210).

Figure 23:
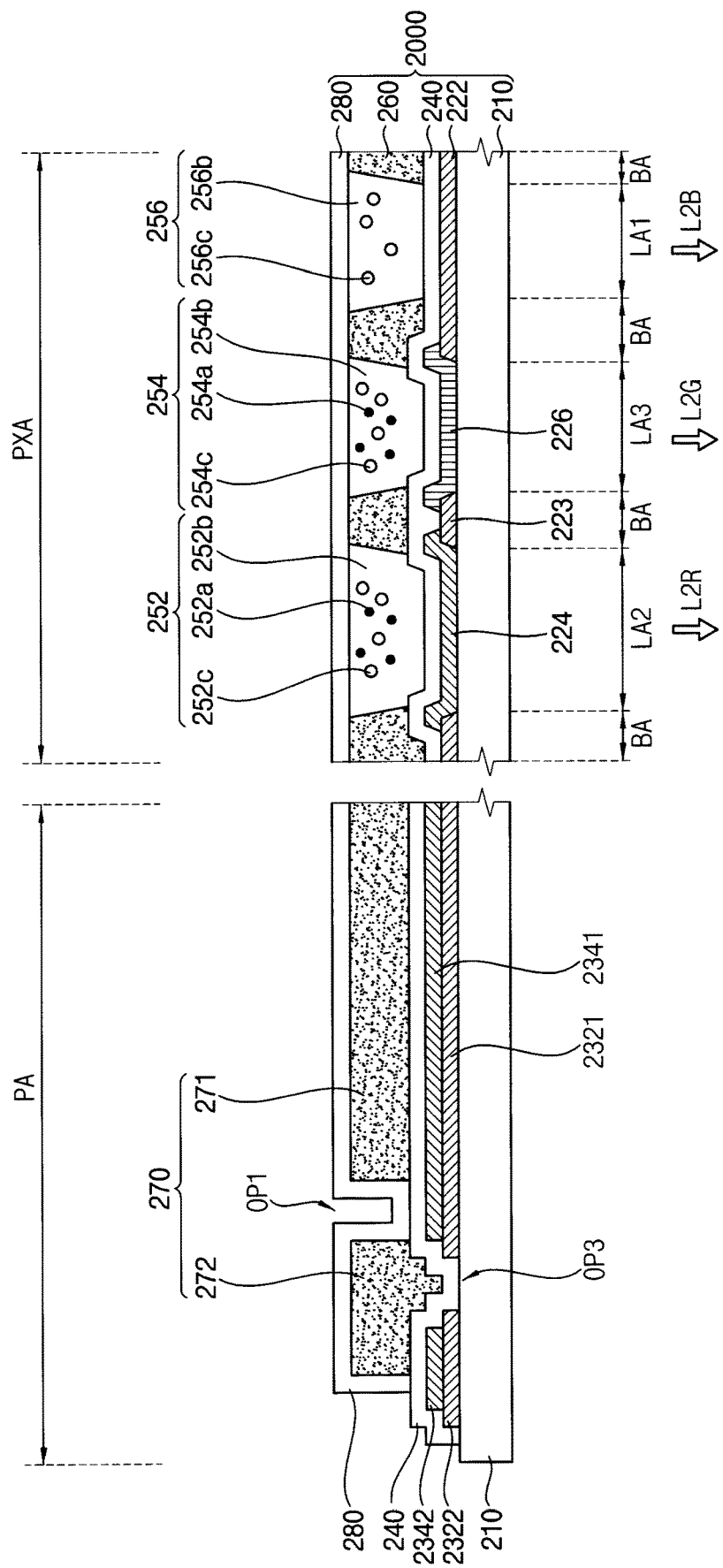

Referring to FIG. 23, the second capping layer 280 may be formed on the first base substrate 210. The second capping layer 280 may be entirely formed in the (e.g., formed in the entire and/or formed in only the) display area DA and the peripheral area PA on the first base substrate 210. The second capping layer 280 may cover the first and second color conversion layers 252 and 254, the transmission layer 256, the partition wall 260, the first compensation structure 271, and the second compensation structure 272. The second capping layer 280 may also cover the first opening OP1, for example, the portion of the first capping layer 240 exposed by the first opening OP1 and the sides of the compensation structure 270 that form the first opening OP1. For example, the second capping layer 280 may be formed to have substantially the same thickness along the profiles of the first and second color conversion layers 252 and 254, the transmission layer 256, the partition wall 260, the first compensation structure 271, and the second compensation structure 272.

Figure 24:
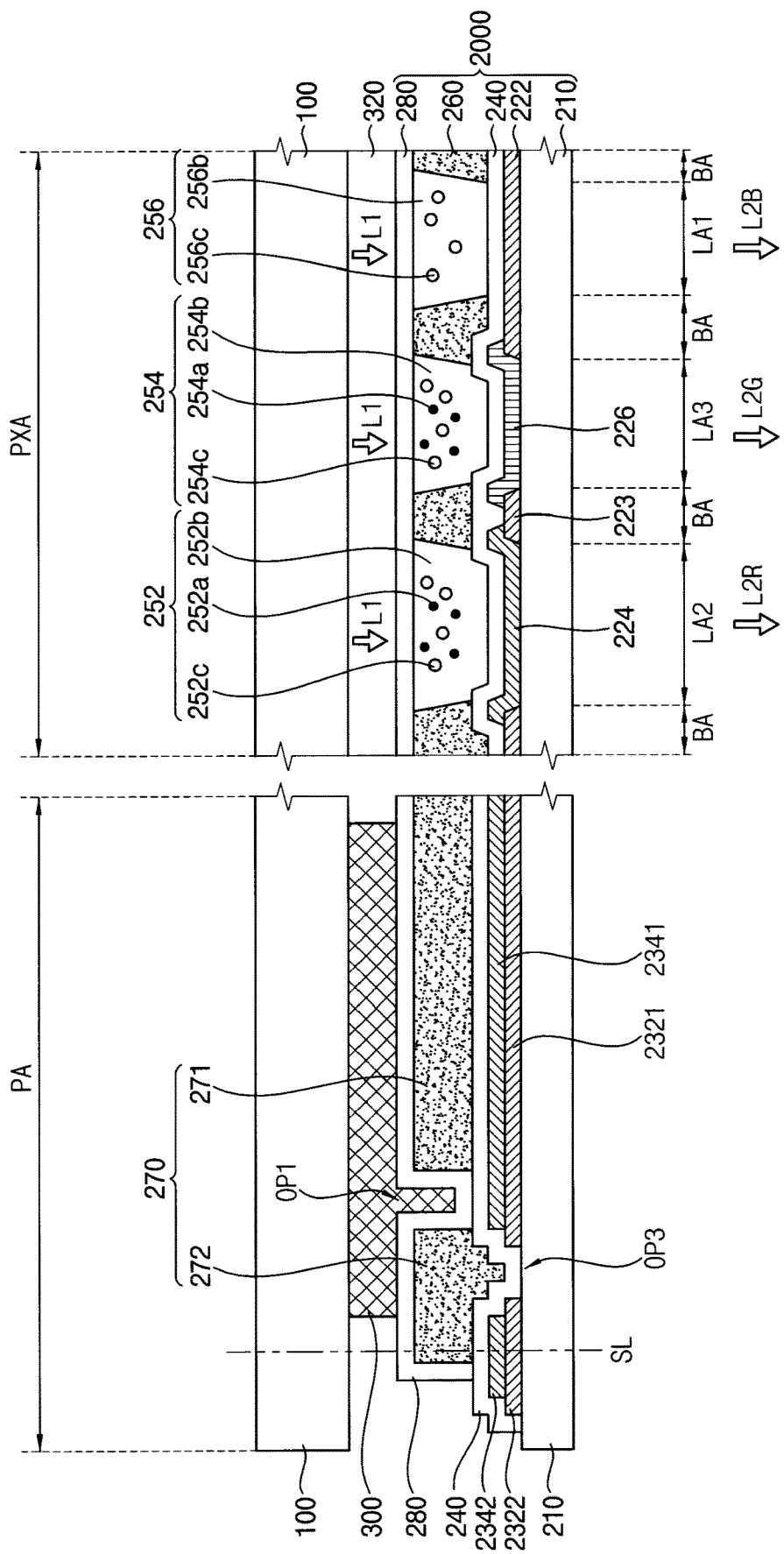

Referring to FIG. 24, the first substrate 100 and the second substrate 2000 may be combined by the sealing member 300. The sealing member 300 may be disposed in the peripheral area PA between the first substrate 100 and the second substrate 2000. For example, the sealing member 300 may overlap at least a portion of the first compensation structure 271, at least a portion of the second compensation structure 272, and the first opening OP1. A portion of the sealing member 300 may be filled in the first opening OP1.

Figure 25:
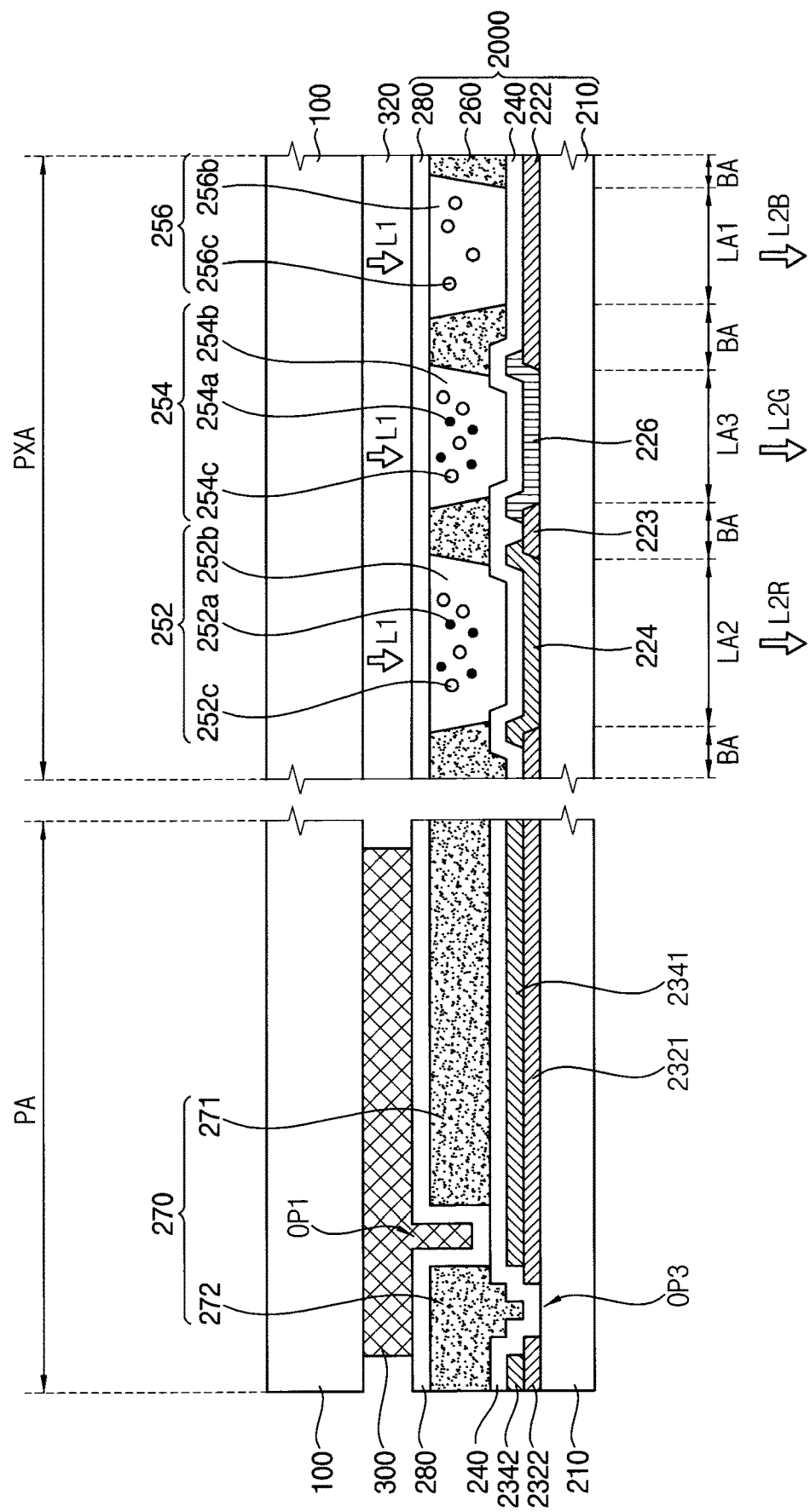

Referring to FIGS. 24 and 25, the combined first and second substrates 100 and 2000 may be cut along a cutting line SL. For example, the cutting line SL may be located in the peripheral area PA. The cutting line SL may be a rectangle around (e.g., surrounding) the display area DA and being spaced apart from the display area DA in a plan view. As cutting the combined first and second substrates 100 and 2000 along the cutting line SL, a width of the peripheral area PA of the display device 11 may be reduced.

Figure 26:
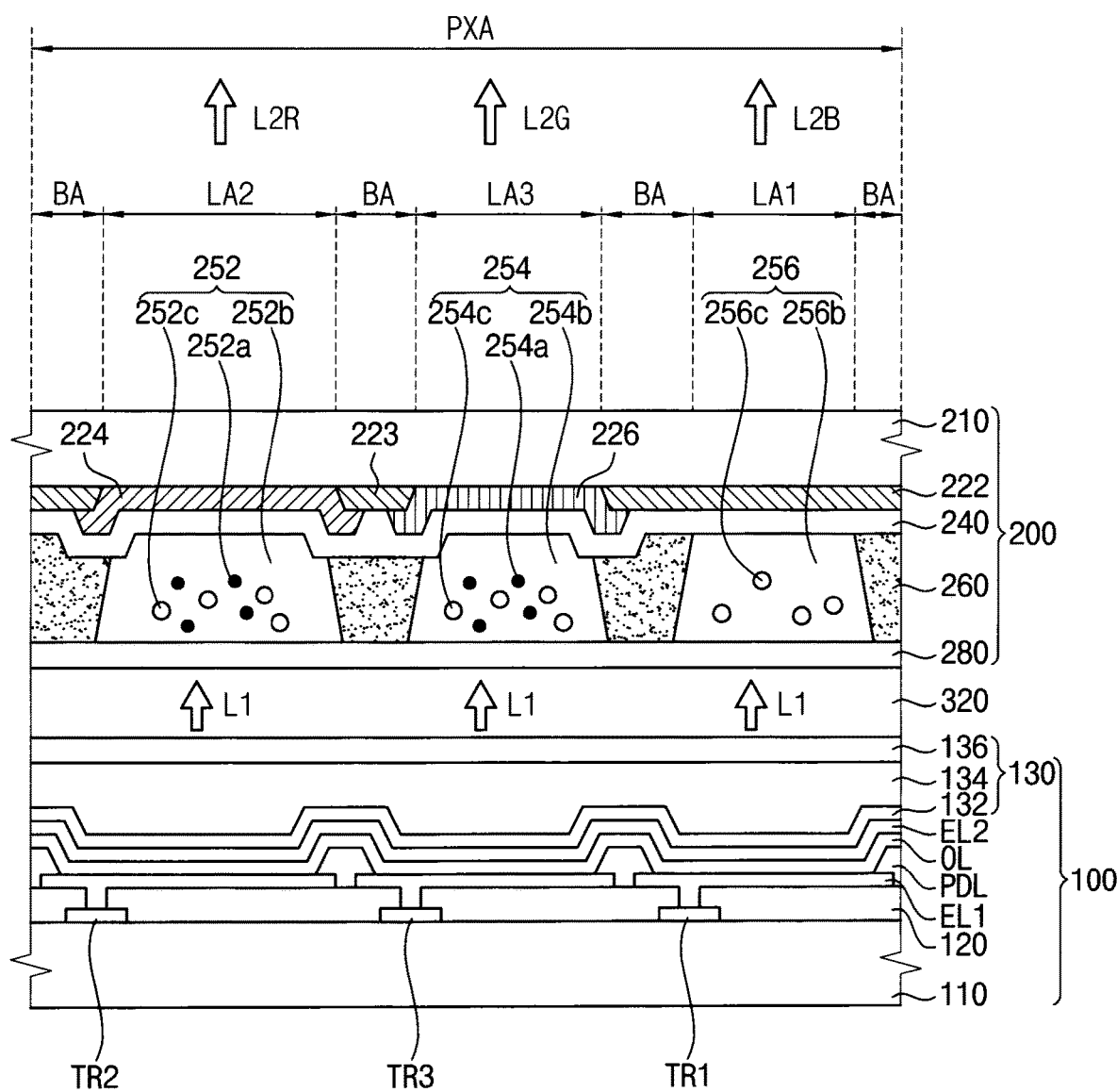
FIG. 26 is a cross-sectional view illustrating a display device according to an embodiment.

FIG. 26 is a cross-sectional view illustrating a display device according to an embodiment.

Referring to FIG. 26, in an embodiment, a display device may include a first substrate 100 and a second substrate 200.

The first substrate 100 may include driving elements TR1, TR2, and TR3 disposed on a second base substrate 110. The driving elements TR1, TR2, and TR3 may be electrically coupled (e.g., connected) to light emitting elements (e.g., to respective light emitting elements). For example, the light emitting element may be an organic light emitting diode. For another example, the light emitting element may be a nano light emitting diode. However, embodiments are not limited thereto.

In an embodiment, each of the driving elements TR1, TR2, and TR3 may include at least one thin film transistor. For example, a channel layer of the thin film transistor may include (e.g., be) amorphous silicon, polycrystalline silicon, a metal oxide semiconductor, and/or the like.

Each of the driving elements TR1, TR2, and TR3 may be covered by an insulation structure 120. The insulation structure 120 may include a combination of an inorganic insulation layer and an organic insulation layer. The insulation structure 120 may have openings (e.g., contact holes) exposing the driving elements TR1, TR2, and TR3, through which the light emitting elements may be electrically coupled (e.g., connected) to respective driving elements TR1, TR2, and TR3.

In some embodiments, the light emitting element (e.g., the organic light emitting diode) may include a first electrode EL1, a second electrode EL2, and an emission layer OL disposed between the first electrode EL1 and the second electrode EL2.

The first electrode EL1 may function as an anode. For example, the first electrode EL1 may be formed as a transmitting electrode or a reflecting electrode according to an emission type (e.g., emission kind) of the display device.

A pixel defining layer PDL may be disposed on the insulation structure 120. The pixel defining layer PDL may have an opening exposing at least a portion of the first electrode EL1. For example, the pixel defining layer PDL may cover a portion (e.g., a side) of the first electrode EL1 and may expose another portion (e.g., a center portion) of the first electrode EL1. For example, the pixel defining layer PDL may include (e.g., be) an organic insulating material. At least a portion of the emission layer OL may be disposed in the opening of the pixel defining layer PDL. In an embodiment, the emission layer OL may continuously extend over a plurality of pixels in the display area DA. For example, the emission layer OL may be a common layer. In another embodiment, the emission layer OL may be separated from an emission layer of an adjacent pixel.

The emission layer OL may include one or more functional layers such as a hole injection layer, a hole transporting layer, an organic light emitting layer, an electron transporting layer, and/or an electron injection layer. In some embodiments, the emission layer OL may include (e.g., be) a low molecular weight organic compound and/or a high molecular weight organic compound.

In an embodiment, the emission layer OL may generate a blue light. However, embodiments are not limited thereto. For example, the emission layer OL may generate a red light, a green light, and/or the like. In another embodiment, the emission layer OL may generate lights having different colors in different pixels.

The second electrode EL2 may be formed as a transmitting electrode or a reflecting electrode according to the emission type (e.g., emission kind) of the display device. For example, the second electrode EL2 may include (e.g., be) a metal, a metal alloy, a metal nitride, a metal fluoride, a conductive metal oxide, or a combination thereof. For example, the second electrode EL2 may continuously extend over a plurality of pixels in the display area DA.

The first substrate 100 may further include an encapsulation layer 130 covering the array of pixels. The encapsulation layer 130 may continuously extend to cover the display area DA (e.g., the entire display area DA).

For example, the encapsulation layer 130 may include a stacked structure of an organic thin film and an inorganic thin film. For example, as illustrated in FIG. 26, the encapsulation layer 130 may include a first inorganic thin film 132, an organic thin film 134 disposed on the first inorganic thin film 132, and a second inorganic thin film 136 disposed on the organic thin film 134. However, embodiments are not limited thereto. For example, the encapsulation layer 130 may have a structure including at least two organic thin films and at least three inorganic thin films.

For example, the organic thin film 134 may include (e.g., be) a cured resin such as polyacrylate, epoxy resin and/or the like. For example, the cured resin may be formed from cross-linking reaction of monomers. For example, each of the first and second inorganic thin films 132 and 136 may include (e.g., be) an inorganic material such as silicon oxide, silicon nitride, silicon carbide, aluminum oxide, tantalum oxide, hafnium oxide, zirconium oxide, titanium oxide, and/or the like.

The second substrate 200 according to the embodiment of FIG. 26 may be substantially the same as or similar to the second substrate 200 according to an embodiment described with reference to FIGS. 4 to 6. Therefore, repeated descriptions may not be provided.

Figure 27:
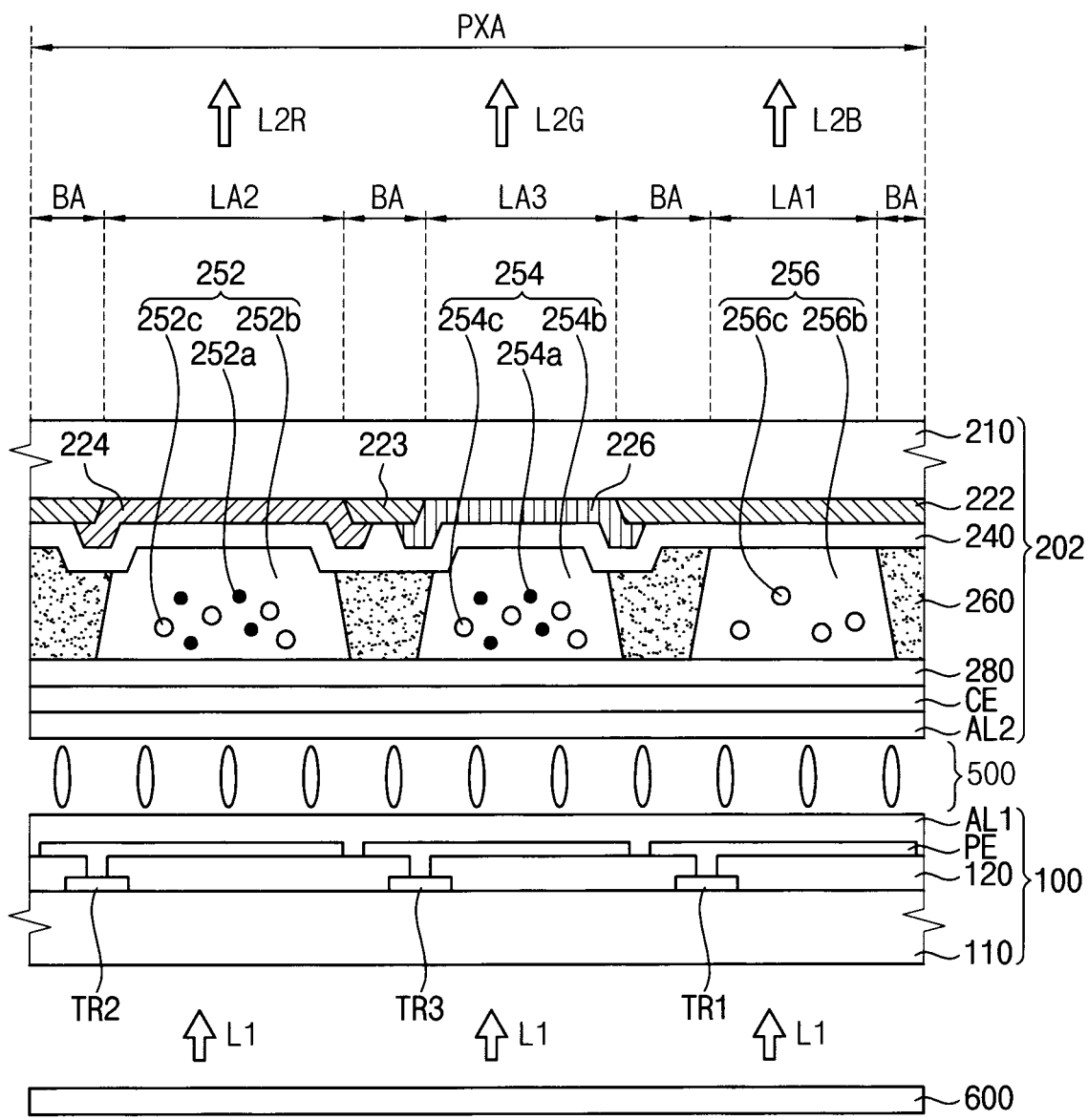
FIG. 27 is a cross-sectional view illustrating a display device according to another embodiment.

FIG. 27 is a cross-sectional view illustrating a display device according to another embodiment.

Referring to FIG. 27, in another embodiment, a display device may include a display panel and a backlight assembly 600. The display panel may include a first substrate 100 and a second substrate 202.

The first substrate 100 may include an array of pixels. A liquid crystal layer 500 may be interposed between the first substrate 100 and the second substrate 202.

Each pixel may include driving elements TR1, TR2 and TR3 and pixel electrodes PE electrically coupled (e.g., connected) to the driving elements TR1, TR2 and TR3. The second substrate 202 may include a common electrode CE. However, embodiments are not limited thereto. For example, the common electrode CE may be included in the first substrate 100.

A first alignment layer AL1 may be disposed on the pixel electrode PE. A second alignment layer AL2 may be disposed on the second substrate 202. The first and second alignment layers AL1 and AL2 may include (e.g., be) a polymer such as polyimide and/or the like, and may be treated by rubbing and/or photo-orientation to have a set or predetermined tilt angle and/or the like.

The second substrate 202 may have a substantially same configuration as the previously explained color-converting substrates except for further including the common electrode CE and the second alignment layer AL2.

The second substrate 202 may be substantially the same as or similar to the second substrate 200 according to an embodiment described with reference to FIGS. 4 to 6 except for further including the common electrode CE and the second alignment layer AL2. Therefore, repeated descriptions may not be provided.

A pixel voltage may be applied to the pixel electrode PE in response to operation of the driving element TR1, TR2 and TR3. A common voltage may be applied to the common electrode CE. Orientation of liquid crystal molecules in the liquid crystal layer 500 may be adjusted by an electric field formed by a difference between the pixel voltage and the common voltage. As a result, a transmittance of an incident light L1 provided by the backlight assembly 600 may be controlled.

Although certain embodiments and implementations have been described herein, other embodiments and modifications will be apparent from this description. Accordingly, the present disclosure is not limited to such embodiments, but rather to the broader scope of the appended claims, equivalents thereof, various suitable, obvious modifications, and equivalent arrangements as would be apparent to a person of ordinary skill in the art.

What is claimed is:

1. A display device comprising:
a first substrate comprising an array of pixels, a pixel of the array of pixels comprising an electrode in the first substrate;
a second substrate coupled to the first substrate; and
a sealing member between the first substrate and the second substrate, wherein the second substrate comprises:
a base substrate comprising a display area overlapping the array of pixels and a peripheral area around the display area;
a first compensation structure in the peripheral area, on the base substrate, at least partially overlapping the sealing member, and comprising an organic material;
a second compensation structure in the peripheral area, on the base substrate, spaced apart from the first compensation structure, at least partially overlapping the sealing member, and comprising the same material as that of the first compensation structure; and
a first capping layer covering the first and second compensation structures and comprising an inorganic material,
wherein the first compensation structure is around the display area,
wherein the second compensation structure is around the first compensation structure, and
wherein the first capping layer covers a lower surface of the first compensation structure facing the first substrate, a lower surface of the second compensation structure facing the first substrate, an outer side surface of the first compensation structure, and an inner side surface of the second compensation structure.

2. The display device of claim 1, wherein a portion of the sealing member is in a first opening between the first compensation structure and the second compensation structure.

3. The display device of claim 1, wherein the sealing member contacts the first capping layer.

4. The display device of claim 1, wherein the second compensation structure is less than first compensation structure in width.

5. The display device of claim 1, wherein a through hole exposing a portion of the first compensation structure is in the second compensation structure.

6. The display device of claim 1, wherein the second substrate further comprises a third compensation structure in the peripheral area, on the base substrate, spaced apart from the second compensation structure, at least partially overlapping the sealing member, and comprising the same material as that of the first compensation structure, and
wherein a portion of the sealing member is in a second opening between the second compensation structure and the third compensation structure.

7. The display device of claim 6, wherein the third compensation structure is around the second compensation structure.

8. The display device of claim 1, wherein the second substrate further comprises:
a color conversion layer in the display area, on the base substrate, and comprising a wavelength-converting particle to change a wavelength of an incident light to emit a light having a color different from the incident light; and
a partition wall in the display area, on the base substrate, and around the color conversion layer, and
wherein the first compensation structure comprises the same material as that of the partition wall.

9. The display device of claim 1, wherein the sealing member comprises:
a first portion overlapping the first compensation structure;
a second portion overlapping the second compensation structure; and a third portion overlapping a first opening between the first compensation structure and the second compensation structure, and wherein the third portion is less than the first portion or the second portion in width.

10. The display device of claim 1, wherein the sealing member comprises spacer particles.

11. A display device comprising:
a first substrate comprising an array of pixels;
a second substrate coupled to the first substrate; and
a sealing member between the first substrate and the second substrate,
wherein the second substrate comprises:
a base substrate comprising a display area overlapping the array of pixels and a peripheral area around the display area;
a first compensation structure in the peripheral area, on the base substrate, at least partially overlapping the sealing member, and comprising an organic material;
a second compensation structure in the peripheral area, on the base substrate, spaced apart from the first compensation structure, at least partially overlapping the sealing member, and comprising the same material as that of the first compensation structure; and
a first capping layer covering the first and second compensation structures and comprising an inorganic material,
wherein the second substrate further comprises:
a functional layer in the peripheral area, between the base substrate and the first compensation structure, between the base substrate and the second compensation structure, and comprising an organic material; and
a second capping layer covering the functional layer and comprising an inorganic material.

12. The display device of claim 11, wherein the first and second compensation structures contact the second capping layer.

13. The display device of claim 11, wherein the functional layer comprises:
a first functional layer around the display area; and
a second functional layer spaced apart from the first functional layer and around the first functional layer.

14. The display device of claim 13, wherein a third opening between the first functional layer and the second functional layer overlaps the first compensation structure.

15. The display device of claim 13, wherein the second capping layer covers a lower surface of the first functional layer facing the first substrate, a lower surface of the second functional layer facing the first substrate, an outer side surface of the first functional layer, and an inner side surface of the second functional layer.

16. The display device of claim 15, wherein the second capping layer exposes an outer side surface of the second functional layer.

17. The display device of claim 11, wherein the second substrate further comprises a color filter layer in the display area and on the base substrate, and
wherein the functional layer comprises the same material as that of the color filter layer.

* * * * *